(12) United States Patent
Kubo et al.

(10) Patent No.: US 6,303,259 B1
(45) Date of Patent: Oct. 16, 2001

(54) HEAT AND LIGHT-SENSITIVE RECORDING MATERIAL AND RECORDING METHOD WITH THE SAME

(75) Inventors: Kazuki Kubo; Toshio Kobayashi; Suguru Nagae; Takamitsu Fujimoto; Keiki Yamada, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/448,465

(22) Filed: Nov. 24, 1999

(30) Foreign Application Priority Data

Nov. 26, 1998 (JP) .................................. 10-335449
Apr. 16, 1999 (JP) .................................. 11-108923
Sep. 13, 1999 (JP) .................................. 11-258557

(51) Int. Cl.$^7$ .............................. G03C 1/72; G03F 7/016
(52) U.S. Cl. .......................... 430/138; 430/157; 430/163; 430/176; 430/151
(58) Field of Search .................... 430/138, 151, 430/157, 163, 176; 427/213.34

(56) References Cited

U.S. PATENT DOCUMENTS 5,603,986 * 2/1997 Tabuuchi et al. ............... 427/213.34
5,789,135 * 8/1998 Katoh et al. ......................... 430/138
5,935,756 * 8/1999 Kaifu et al. .......................... 430/138
5,945,247 * 8/1999 Shimada .............................. 430/138
5,952,131 * 9/1999 Kumacheva et al. ................ 430/21
5,972,555 * 10/1999 Fernandez-Puente ............... 430/138

OTHER PUBLICATIONS

"TA" "(Therno–Autochrome)–Development of a Full Color Direct Thermal Recording Material", *Fujifilm Research & Development*, No. 40, pp. 13–21, 1995.

"Industrial Applications of Microcapsule Technology", siki–zai (color material), 55[9] pp. 644–656, 1982.

* cited by examiner

*Primary Examiner*—John S. Chu
(74) *Attorney, Agent, or Firm*—Leydig, Voit & Mayer, Ltd.

(57) ABSTRACT

A recording material having a recording layer with microcapsules therein on a support, and a recording method. The microcapsules constituting the recording layer each are composed of a core, a heat-responsive resin layer covering the core, and a shell enveloping the heat-responsive resin layer. The shell is made of a material sensitive to and curable with light having a predetermined wavelength, the core contains a developer (or a dye precursor), and the shell contains a dye precursor (or a developer).

20 Claims, 11 Drawing Sheets

HEAT AND LIGHT-SENSITIVE RECORDING MATERIAL AND RECORDING METHOD WITH THE SAME

BACKGROUND OF THE INVENTION

1. Field of the Invention

The present invention relates to a heat and light-sensitive recording material and a recording method for color duplicators, color printers, etc.

2. Description of the Related Art

For conventional full-color imaging methods, known are various systems of silver film photography, thermal recording (with hot-melting or subliming media), electrophotography, ink-jetting recording, etc. Silver film photography and thermal recording give high-quality images, but have the disadvantage of leaving wastes of developers, ink ribbons, etc. On the other hand, electrophotography requires toner, and ink-jetting recording requires ink.

Apart from the media for such known imaging systems, self-coloring recording media are now studied. One is for a light and pressure-sensitive recording system. In the system, light and pressure-sensitive microcapsules in a form of are first exposed to light to produce a cured part and a non-cured part of the microcapsules and thereafter the non-cured part of the microcapsules are broken under pressure, whereby the colored inclusion having been in the microcapsules is transferred onto paper, or the inclusion, dye precursor is reacted with a developer having been prepared outside the microcapsules to give color images. This is described in detail in the Pre-print for the 1st Discussion Meeting of the Electrophotographic Society of Japan, 1992, on page 47.

Another is for a heat and light-sensitive recording system. For this, TA paper (Thermo-Autochrome paper from Fuji Photo Film) is known. Briefly, in the system, heat-responsive microcapsules containing a dye precursor, diazonium salt are controlled by heat, whereby the contact between the inclusion and a developer and an organic base compound having been prepared outside the microcapsules is controlled, or that is, the reaction between them is controlled to thereby control the dye formation resulting from the contact reaction. Next, the microcapsules are exposed to UV rays so as to decompose the dye precursor. The thus-decomposed dye precursor no more reacts with the coupler, and therefore gives no color. The latter stage is for color image fixation. The heat-responsive microcapsules are meant to indicate microcapsules of which the substance permeability through their walls varies under heat. For full-color imaging in the system, the heat-responsive microcapsules themselves and the diazonium salt to be therein are specifically defined. The details of the system are in *Printer Materials and Chemicals* (edited by Kyosuke Takahashi and Masahiro Irie, published by CMC, 1995).

In the light and pressure-sensitive recording system for conventional self-coloring recording media, the microcapsules must be broken under pressure, and therefore their size could not easily be reduced. The problem with the system is that breaking the microcapsules lowers the image resolution and roughens the image quality.

On the other hand, TA paper for the heat and light-sensitive recording system requires at least three layers of yellow (hereinafter referred to as "Y"), magenta (referred to as "M") and cyan (referred to as "C"), and requires UV rays having different wavelengths for image fixation thereon. In addition, it requires a thermal head for writing images thereon. The problem with the system is that the image resolution is limited and the writing energy is large.

In that situation, the present invention is to solve the drawbacks in the prior art noted above, and its object is to provide a recording material for an imaging system of heat and light-sensitive coloration combined with light-sensitive image fixation, and to provide a recording method with it.

SUMMARY OF THE INVENTION

The invention provides a heat and light-sensitive recording material comprising a recording layer of microcapsules formed on a support, in which each microcapsule is composed of a core, a heat-responsive resin layer to cover the core, and a shell to envelop the heat-responsive resin layer. In this, the shell is made of a material sensitive to and curable with light having a predetermined wavelength, the core contains a developer (or a dye precursor), and the shell contains a dye precursor (or a developer).

In the invention, the constitution of the microcapsules may be so modified that the core but not the shell is made of a material sensitive to and curable with light having a predetermined wavelength. Therefore, the invention also provides a heat and light-sensitive recording material comprising a recording layer of microcapsules formed on a support, in which each microcapsule is composed of a core of a material sensitive to and curable with light having a predetermined wavelength, a heat-responsive resin layer to cover the core, and a shell to envelop the heat-responsive resin layer. In this, the core contains a developer (or a dye precursor), and the shell contains a dye precursor (or a developer)

In the invention as above, the core and the shell constituting each microcapsule separately contain a dye precursor and a developer. In another modification of the invention, multicore-multiplex microcapsules may be used. In this, plural cores are enveloped in a shell to form one microcapsule, and the plural cores and the shell separately contain a dye precursor and a developer. Therefore, the invention further provides a heat and light-sensitive recording material comprising a recording layer of microcapsules formed on a support, in which each microcapsule is composed of a plurality of cores each covered with a heat-responsive resin layer, and a shell to envelop all the heat-sensitive resin layer-covered cores. In this, at least any one of the plural cores and the shell is made of a material sensitive to and curable with light having a predetermined wavelength, and any of the plural cores and the shell separately contains a dye precursor and a developer.

DETAILED DESCRIPTION OF THE PREFERRED EMBODIMENTS

Figure 1A:
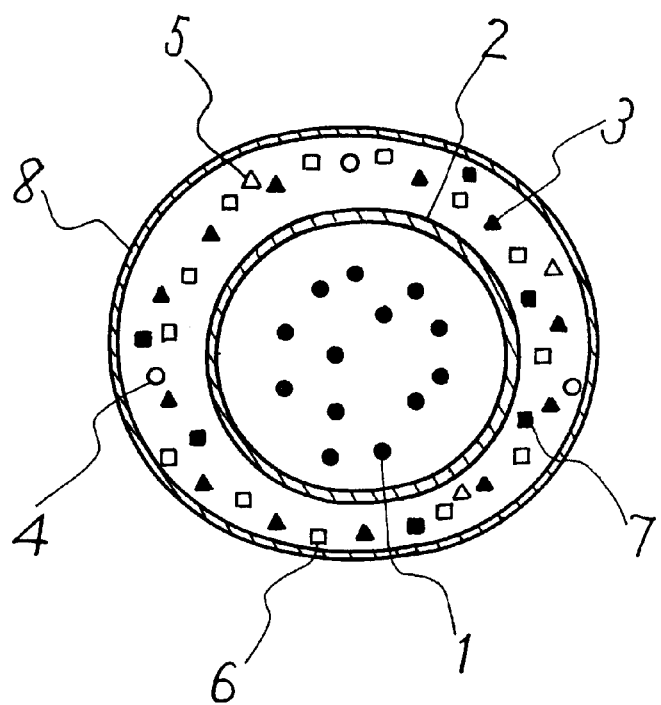
FIG. 1a and FIG. 1b are graphic views showing models of the microcapsules for use in the invention.

One embodiment of the microcapsules to be used in the heat and light-sensitive recording material of the invention is in FIG. 1a. FIG. 1a is a graphic view showing the constitution of one embodiment of the microcapsules in which the heat-responsive resin layer envelops a diazonium salt. In this, 1 indicates a dye precursor, diazonium salt; 2 indicates a heat-responsive resin layer; 3 indicates a coupler serving as a developer; 4 indicates a wavelength-dependent sensitizer; 5 indicates a photo-polymerization initiator; 6 indicates a polymerizing substance; 7 indicates a basic substance; 8 indicates a resin layer to cover the shell of the microcapsule; and the wavelength-dependent sensitizer 4, the photo-polymerization initiator 5 and the polymerizing substance 6 constitute the photo-curable shell.

At least three different types of microcapsules all having the constitution as above but each forming any of different colors of Y, M and C are prepared by selecting a predetermined wavelength-dependent sensitizer or a predetermined developer for each type of the microcapsules. These microcapsules are mixed with a binder, and applied onto a support to produce a heat and light-sensitive recording material of the invention.

The recording principle with the thus-produced, heat and light-sensitive recording material of the invention is described. The heat and light-sensitive recording material is first exposed to light of three waves having different wavelengths for image signals, for example, to visible rays R, G and B, whereupon the polymerizing substance existing in the shells of the microcapsules sensitive to the respective light waves begin to polymerize and are then cured. In this stage, the shells of the microcapsules in the non-exposed area still have fluidity. Next, the microcapsules are heated up nearly to the temperature of the glass transition point of the heat-responsive resin layer, whereby the substance-separating ability of the heat-responsive resin layer is attenuated. In each microcapsule in that condition, the heat responsive resin layer permits the couple in the non-exposed area to be in contact with the diazonium salt so as to form the predetermined color. In this, the coupler-containing area having been cured through exposure cannot be contacted with the diazonium salt, and therefore forms no color. If desired, the entire surface of the thus-processed material is exposed to UV rays so as to decompose the non-colored diazonium salt for image fixation, whereby the storage stability of the image formed is enhanced.

The temperature at which the heat and light-sensitive recording material is heated preferably falls between 50 and 200° C. If the heating temperature is lower than 50° C., the a storage stability of the image will be poor; but if higher than 200° C., the color tone of the image will be not good.

As in the above, the heat and light-sensitive recording material of the invention does not require pressure application thereto in the imaging step. Therefore, reducing the size of the microcapsules for the material is not restricted. Accordingly, in the recording method with the heat and light-sensitive recording material of the invention, the microcapsules for the material can be well small-sized ones, and therefore can produce high-quality images. Further in the recording method with the heat and light-sensitive recording material of the invention, the non-coloring area is formed through exposure to light. According to the recording method, therefore, it has become possible to obtain fine, high-resolution images even though the coloration of the material is assisted by heat. In addition, in the recording method with the heat and light-sensitive recording material of the invention, since the characteristic change in the heat-responsive resin layer is attained at relatively low temperatures falling between 50 and 200° C. or so, the energy for image formation can be reduced.

For producing the microcapsules for use in the heat and light-sensitive recording material of the invention, employable are any known methods of microcapsulation, including, for example, in-situ polymerization, interfacial polymerization, coacervation, spray-drying and the like, such as those described in *Microcapsules* (written by Tomoji Kondo, published by Nikkan Kogyo Shinbun, 1970). In particular, for forming the heat-responsive resin layer, preferred is interfacial polymerization or in-situ polymerization.

Specifically, the microcapsules may be produced according to a method that comprises forming sub-microcapsules, each composed of a core and a heat-responsive resin layer, from an oil/water emulsion, substituting the water phase of the emulsion with an oil phase of light-sensitive shell material to obtain a mixture containing sub-microcapsules, and then dispersing the mixture in a water phase to obtain the microcapsules in a form of dispersion.

As the medium of forming the cores for use in the heat and light-sensitive recording material of the invention, preferred is a high-boiling-point organic solvent. For example, it includes alkylnaphthalenes, alkyldiphenylethanes, alkyldiphenylmethanes, diphenylethane-alkyl adducts, alkylbiphenyls, chloroparaffins; phosphoric acid derivatives such as tricresyl phosphate; as well as maleates, phthalates, adipates, etc. If diazonium salts could not fully dissolve in such high-boiling-point solvents, the high-boiling-point solvent may be combined with a low-boiling-point solvent for use herein. The low-boiling-point solvent includes, for example, ethyl acetate, butyl acetate, methylene chloride, tetrahydrofuran, acetone, etc. Two or more of those solvents may be combined for use herein. Where the core contains a water-soluble compound, such as a water-soluble diazonium salt, water is generally used as the solvent.

One example of the dye precursor for use in the heat and light-sensitive recording material of the invention is a diazonium salt. As a rule, diazonium salts react with couplers such as phenolic compounds or active methylene-having compounds to form dyes. Also as a rule, they are decomposed when exposed to light (in general, to UV rays), and are thereby inactivated through denitrogenation.

Various diazonium salts are described, for example, in Japanese Patent Laid-Open Nos. 184880/1985, 172789/1986, 147285/1990, 328853/1994, 096671/1995, 125446/1995, etc., any of which are employable herein. For example, herein employable are diazonium salts such as 4-(4'-methylphenylthio)-2,5-diethoxybenzene-diazonium, 4-pyrrolidino-3-methylbenzene-diazonium, 4-morpholino-2,5-dibutoxybenzene-diazonium, 4-morpholinobenzene-diazonium, 4-morpholino-2,5-octoxybenzene-diazonium, 4-(N-(2-ethylhexanoyl) piperazino)-2,5-diethoxybenzene-diazonium, 4-N, N-diethylaminobenzene-diazonium, 3-(2-octyloxyethoxy)-morpholinobenzene-diazonium, 4-N-hexyl-N-tolylamino-2-hexyloxybenzene-diazonium, etc. The acid anions for the diazonium salts include, for example, hexafluorophosphate, tetrafluoroborate, 1,5-naphthalenesulfonate, perfluoroalkylcarbonates, perfluoroalkylsulfonates, zinc chloride, tin chloride, etc. In the process of producing microcapsules, where the salts are dissolved in water, they are preferably zinc chloride salts. On the other hand, where the salts are dissolved in organic solvents, it is desirable that they have an acid anion of hexafluorophosphate, tetrafluoroborate or 1,5-naphthalenesulfonate, in view of their solubility in organic solvents. For use in the invention, two or more different types of diazonium salts may be combined in any desired ratio.

In the heat and light-sensitive recording material of the invention, the heat-responsive resin layer acts as a partition wall, for which are usable any of polyurethanes, polyureas, crosslinked gelatins, alginates, celluloses, melamine resins, nylon resins, urea-formaldehyde resins, dextrins, poly (1,4-piperazine-alt-terephthalic acids), etc. Of those, preferred are polyureas and polyurethanes.

For the photo-curable material sensitive to and curable with light having a predetermined wavelength, which is used in the invention, generally employed are polymerizing substances that contain a photo-polymerization initiator. If desired, the polymerizing substances may further contain a wavelength-dependent sensitizer. For example, for the combination of the same polymerizing substance and the same photo-polymerization initiator, different types of wavelength-dependent sensitizer may be selected and applied thereto so as to specifically select the wavelength of the light with which the polymerizing substance is photo-cured.

In the heat and light-sensitive recording material of the invention, the material to form the shells of the microcapsules may optionallycontain a heat-sensitizer, which is effective for realizing color-forming reaction even at low temperatures.

The polymerizing substance includes, for example, acrylates, acrylamides, methacrylic acids, methacrylates, methacrylamides, maleic anhydrides, maleates, styrenes, vinyl ethers, vinyl esters, allyl ethers, etc. Preferred are acrylates and methacrylates, as their polymerization rate is high.

The photo-polymerization initiator includes, for example, aromatic carbonyl compounds, acetophenones, organic peroxides, organic halides, azo compounds, dye-borate complexes, metal-arene complexes, etc. Preferred are ($\eta$5-2,4-cyclopentadien-1-yl)[(1,2,3,4,5,6-$\eta$)-(1-methylethyl) benzene] iron (1+) hexafluorophosphate (1−), 4,4'-tetrakis (t-butyldioxycarbonyl) benzophenone, iodonium salts, alkylborates, etc.

The ratio of the photo-polymerization initiator to the polymerizing substance may fall between 0.1 and 20% by weight, but preferably between 1 and 10% by weight. If the ratio is smaller than 1% by weight, the polymerization reaction will be difficult to promote. However, even though the ratio is larger than 10% by weight, the sensitivity in the reaction could increase little.

As the wavelength-dependent sensitizer, selectively employed is a sensitizer capable of absorbing a specific wavelength of light from the light source used. For example, it includes acrylorange dyes, benzofuran dyes, merocyanine dyes, xanthene dyes, cyanine dyes, thiazine dyes, azine dyes, methine dyes, oxazine dyes, phenylmethane dyes, azo dyes, anthraquinone dyes, pyrazoline dyes, stilbene dyes, quinoline dyes, rhodamine dyes, safranine dyes, malachite green dyes, methylene blue dyes, coumarin dyes, squalilium dyes, etc. For R light, preferred are squalilium dyes; for G light, preferred are cyanine dyes; and for B light, preferred are coumarin dyes.

The ratio of the wavelength-dependent sensitizer to the polymerizing substance preferably falls between 1 and 100% by weight, more preferably between 5 and 20% by weight. If the ratio is smaller than 1% by weight, the sensitizer could not satisfactorily exhibit its capability; but if larger than 100% by weight, the color purity will be lowered.

As the heat-sensitizer, usable are arylsulfonamides such as toluenesulfonamide, ethylbenzenesulfonamide, etc. For use in the invention, two or more different types of heat-sensitizers may be combined.

Examples of the developer for use in the heat and light-sensitive recording material of the invention include couplers and basic substances. In general, the developer may be a coupler alone and/or a combination of a coupler and a basic substance.

Various couplers are described in Japanese Patent Laid-Open Nos. 67379/1989, 54250/1990, 53794/1992, 223367/1995, 223368/1995, etc., any of which are employable herein. For example, couplers usable herein include resorcinols, phloroglucinols, pyrazolone derivatives, $\beta$-diketone derivatives, oxydiphenyl derivatives, naphthol derivatives (e.g., $\alpha$-naphthol, etc.), phenols, etc. Different types of such couplers may be mixed to give intended colors. As specific examples of the couplers, mentioned are resorcinol, phloroglucinol, sodium 2,3-dihydroxynaphthalene-6-sulfonate, 1-hydroxy-2-naphthoic acid morpholinopropylamide, 1,5-dihydroxynaphthalene, 2,3-dihydroxynaphthalene, 2,3-dihydroxy-6-sulfonylnaphthalene, 2-hydroxy-3-naphthoic acid anilide, 2-hydroxy-3-naphthoic acid ethanolamide, 2-hydroxy-3-naphthoic acid octylamide, 2-hydroxy-3-naphthoic acid N-dodecyloxypropylamide, 2-hydroxy-3-naphthoic acid tetradecylamide, acetanilide, acetoacetanilide, benzoylacetanilide, 2-chloro-5-octylacetoacetanilide, 1-phenyl-3-methyl-5-pyrazolone, 1-(2'-octylphenyl)-3-methyl-5-pyrazolone, 1-(2',4',6'-trichlorophenyl)-3-benzamido-5-pyrazolone, 1-(2',4',6'-trichlorophenyl)-3-anilino-5-pyrazolone, 1-phenyl-3-phenylacetamido-5-pyrazolone, 1-(2-dodecyloxyphenyl)-2-methylcarbonatocyclohexane-3,5-dione, 1-(2-dodecyloxyphenyl)cyclohexane-3,5-dione, N-phenyl-N-dodecylbarbituric acid, N-phenyl-N-(3-stearyloxy) butylbarbituric acid, etc. Two or more of these couplers may be combined to obtain intended colors.

Various basic substances are described in Japanese Patent Laid-Open Nos. 1371/1990, 63187/1989, etc., any of which are employable herein. These include not only inorganic or organic basic compounds but also compounds capable of releasing alkaline substances through decomposition under heat. Typically mentioned are nitrogen-containing compounds such as organic ammonium salts, organic amines, amides, urea and thiourea and their derivatives, thiazoles, pyrroles, pyrimidines, piperazines, guanidines, indoles, imidazoles, imidazolines, triazoles, morpholines, piperidines, amidines, formamidines, pyridines, etc. Their specific examples include tricyclohexylamine, tribenzylamine, octadecylbenzylamine, stearylamine, allylurea, thiourea, methylthiourea, allylthiourea, ethylenethiourea, 2-benzylimidazole, 4-phenylimidazole, 2-phenyl-4-methylimidazole, 2-undecylimidazoline, 2,4,5-trifuryl-2-imidazoline, 1,2-diphenyl-4,4-dimethyl-2-imidazoline, 2-phenyl-2-imidazoline, 1,2,3-triphenylguanidine, 1,2-dicyclohexylguanidine, 1,2,3-tricyclohexylguanidine, guanidine trichloroacetate, N,N'-dibenzylpiperazine, 4,4'-dithiomorpholine, morpholinium trichloroacetate, 2-aminobenzothiazole, 2-benzoylhydrazinobenzothiazole, etc. Two or more of these may be combined for use herein.

As a rule, it is suitable that the ratio by mol of the coupler to the diazonium salt falls between 1 and 10, but preferably between 1.5 and 6.5. The amount of the basic compound to be used varies, depending on its basic intensity, but may fall between 0.3 and 5 mols or so, relative to one mol of the diazonium salt to be combined with the compound.

In the invention, the shell of each microcapsule may be covered with a resin layer that acts to prevent the developer from flowing away. For the resin layer, usable are various substances including, for example, polyurethanes, polyureas, crosslinked gelatins, alginates, celluloses, melamine resins, nylon resins, urea-formaldehyde resins, dextrins, poly (1,4-piperazine-terephthalic acids), etc.

Figure 1B:
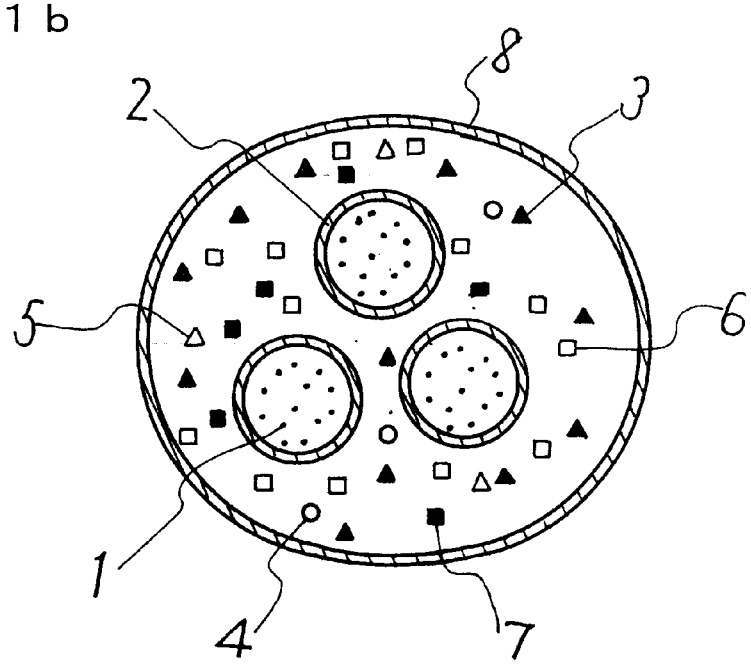

In the heat and light-sensitive recording material of the invention, a plurality of cores may exist in one microcapsule. The microcapsules of that type also attain the same effect of the invention as above. FIG. 1b shows a model of a multicore-multiplex microcapsule of that type, in which the heat-responsive resin layer 2, envelops a diazonium salt 1. The multicore-multiplex microcapsules are meant to indicate microcapsules each having a plurality of sub-microcapsules therein.

Figure 2A:
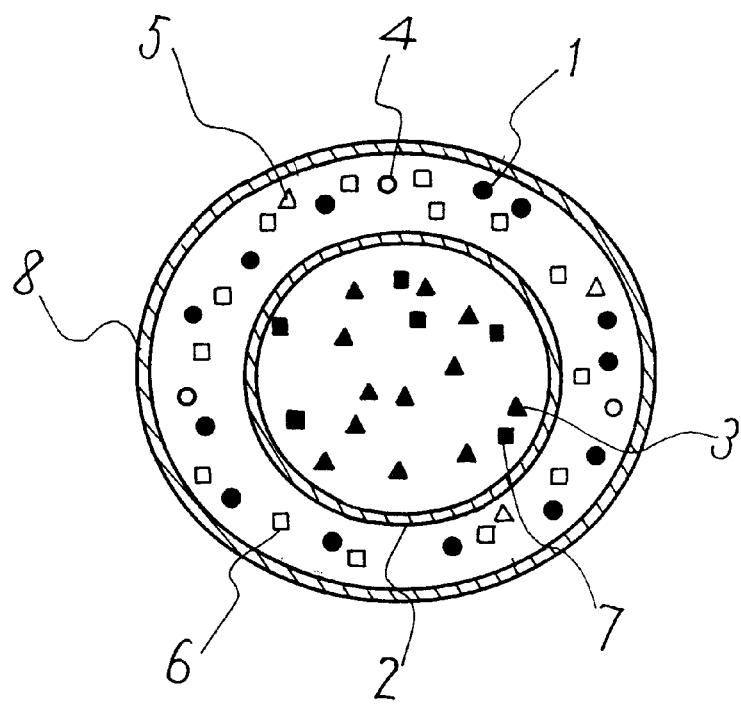
FIG. 2a and FIG. 2b are graphic views showing models of the microcapsules for use in the invention.
Figure 2B:
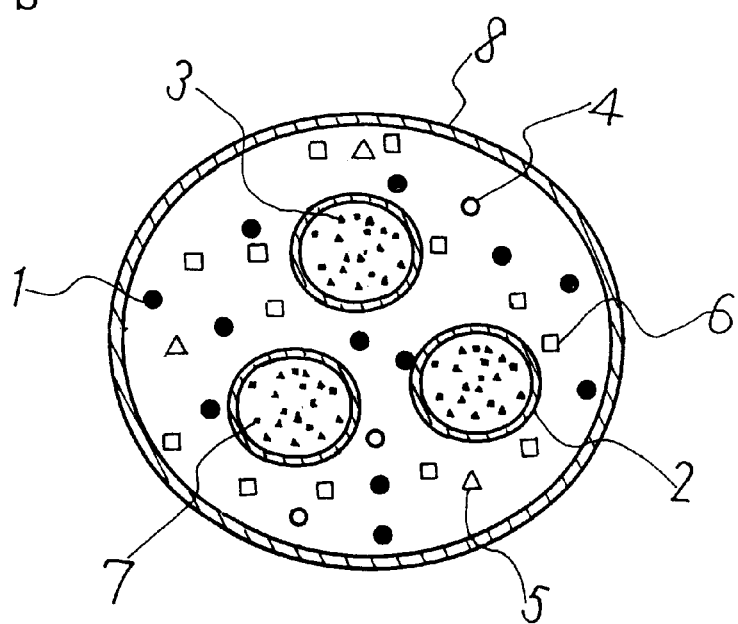

In the heat and light-sensitive recording material of the invention, the core in each microcapsule may contain a developer and a basic substance while the shell contains a dye precursor. The embodiment of this type also attains the same effect as above. FIG. 2a shows a model of a microcapsule of this embodiment, in which the heat-responsive resin layer 2 envelops a coupler 3 and a basic substance 7. FIG. 2b shows a model of a multicore-multiplex microcapsule of this embodiment, in which the heat-responsive resin layer 2 of each sub-microcapsule, envelops a coupler 3 and a basic substance 7.

Figure 3A:
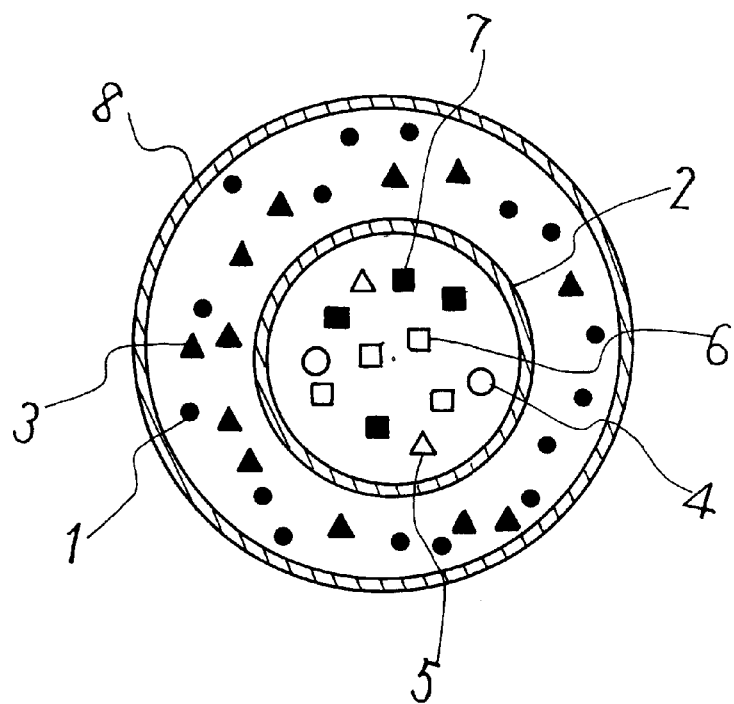
FIG. 3a and FIG. 3b are graphic views showing models of the microcapsules for use in the invention.
Figure 3B:
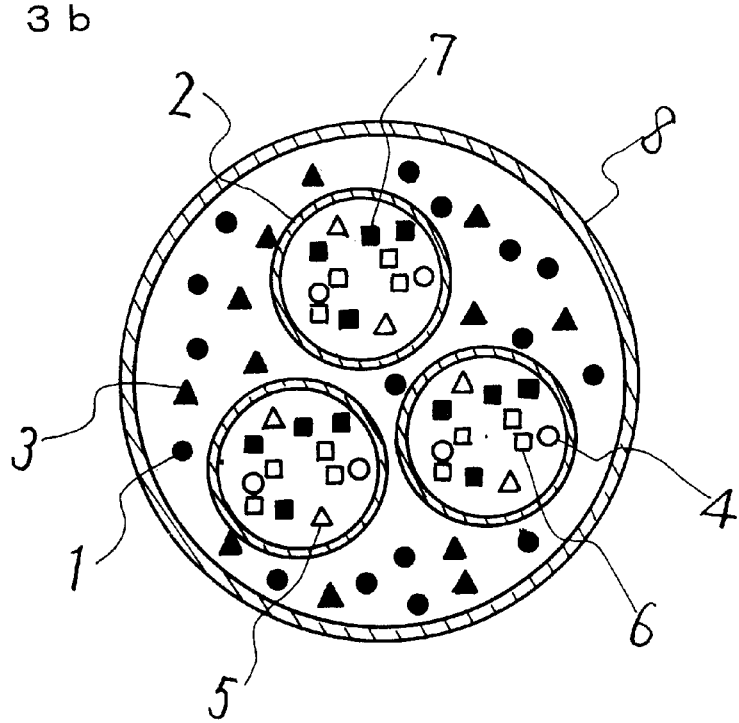

In the heat and light-sensitive recording material of the invention, the core but not the shell of each microcapsule may be made of a material sensitive to and curable with light having a predetermined wavelength. FIG. 3a shows a model of a microcapsule of this type, in which the heat-responsive resin layer 2 envelops a wavelength-dependent sensitizer 4, a photo-polymerization initiator 5, a polymerizing substance 6 and a basic substance 7. FIG. 3b shows a model of a multicore-multiplex microcapsule of this embodiment, in which the heat-responsive resin layer 2 of each sub-microcapsule envelops a wavelength-dependent sensitizer 4, a photo-polymerization initiator 5, a polymerizing substance 6 and a basic substance 7.

Figure 4A:
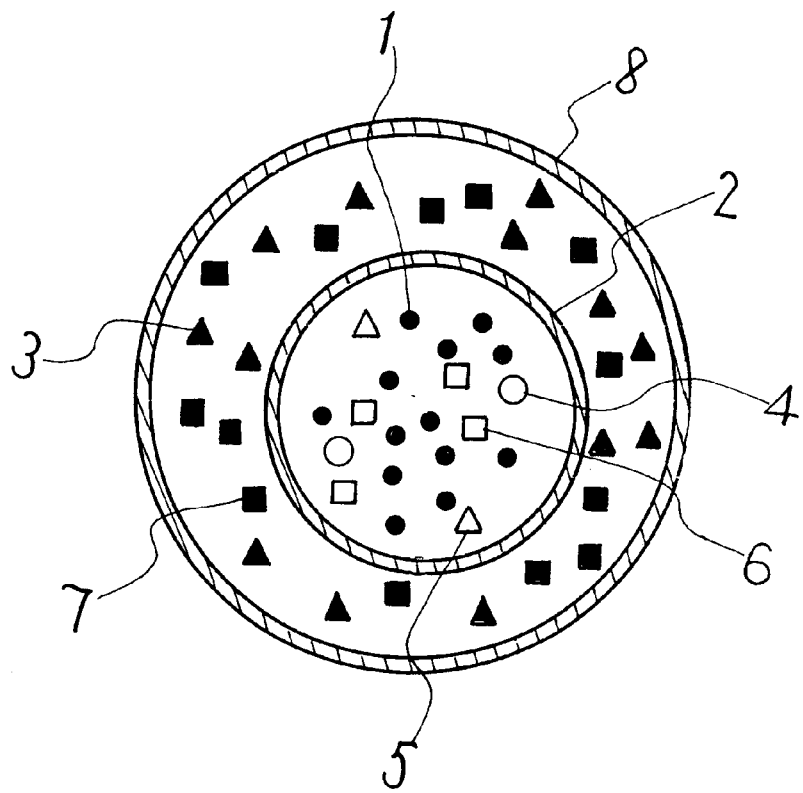
FIG. 4a and FIG. 4b are graphic views showing models of the microcapsules for use in the invention.
Figure 4B:
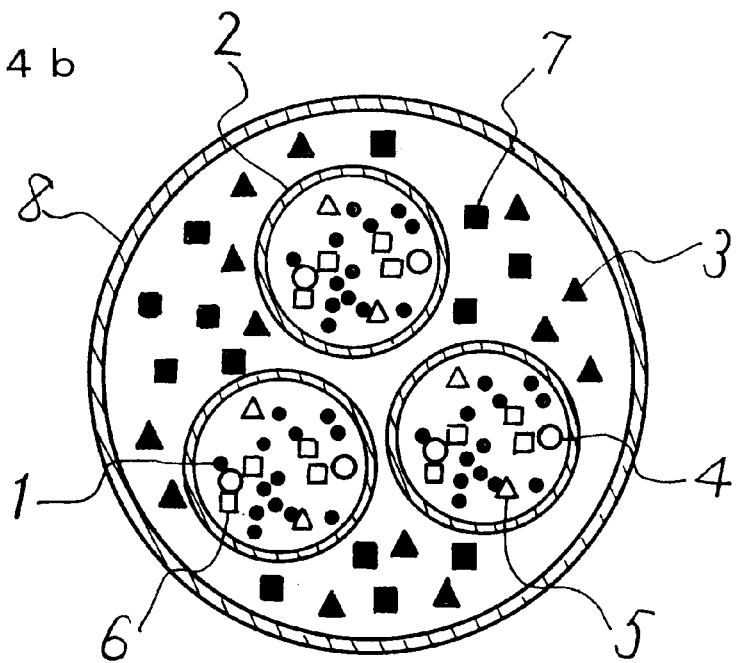

In the embodiment illustrated above, the shell contains a dye precursor and a developer. Being different from this, the core but not the shell may contain a dye precursor. This modification also attains the same effect as above. Models of this modification are in FIG. 4a and FIG. 4b. Specifically, FIG. 4a shows a model of a microcapsule of this modification, in which the heat-responsive resin layer 2 envelops a diazonium salt 1, a wavelength-dependent sensitizer 4, a photo-polymerization initiator 5 and a polymerizing substance 6. FIG. 4b shows a model of a multicore-multiplex microcapsule 2 of this modification, in which the heat-responsive resin layer of each sub-microcapsule envelops a diazonium salt 1, a wavelength-dependent sensitizer 4, a photo-polymerization initiator 5 and a polymerizing substance 6.

In the heat and light-sensitive recording material of the invention, the dye precursor may be an electron-donating dye precursor, and the developer may be an electron-accepting compound. This embodiment containing such an electron-donating dye precursor as combined with such an electron-accepting compound may additionally contain a color development promoter capable of promoting the color-forming reaction between the two.

In the invention, where an electron-donating dye precursor is combined with an electron-accepting compound that serves as a developer, a color development promoter may be applied to the combination. Applying it thereto is desirable, as the color development promoter promotes the color-forming reaction between the two.

Figure 5:
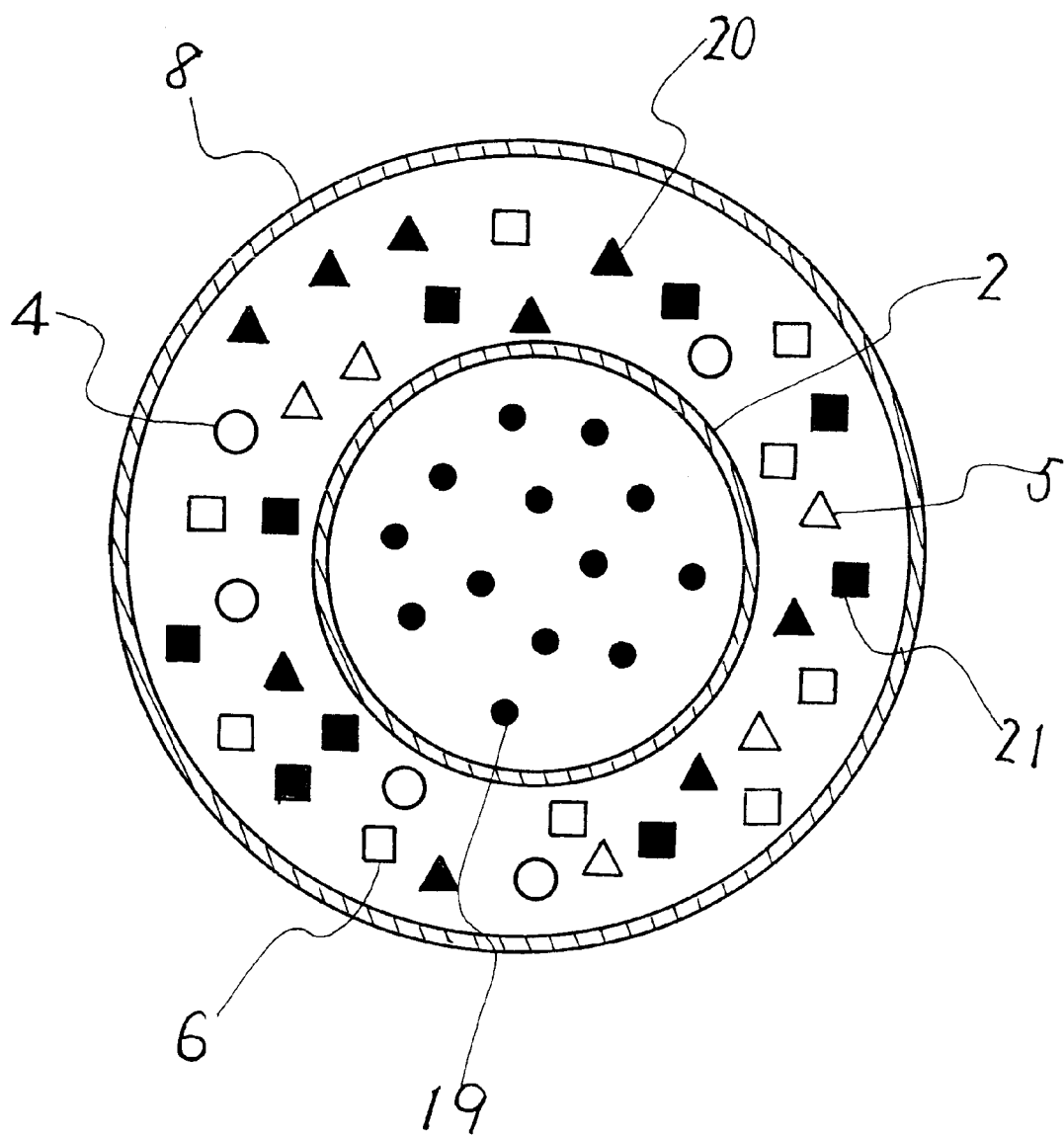
FIG. 5 is a graphic view showing a model of the microcapsules for use in the invention.

FIG. 5 shows a model of a microcapsule of this embodiment, in which the core contains an electron-donating dye precursor, and the shell contains a sensitizer and an electron-accepting compound that serves as a developer. In FIG. 5, 19 indicate an electron-donating dye precursor; 20 indicate an electron-accepting compound; and 21 indicates a color development promoter.

The electron-donating dye precursor includes, for example, triarylmethane compounds, diphenylmethane compounds, thiazine compounds, xanthene compounds, spiropyran compounds, etc. Especially preferred are triarylmethane compounds and xanthene compounds, as giving high-density colors.

Specific examples of the compounds include 3,3-bis (p-dimethylaminophenyl)-6-dimethylaminophthalide, 3,3-bis (p-dimethylaminophenyl) phthalide, 3-(p-dimethylaminophenyl)-3-(1,3-dimethylindol-3-yl) phthalide, 3- (p-dimethylaminophenyl) -3-(2-methylindol-3-yl) phthalide, 3-(o-methyl-p-dimethylaminophenyl)-3-(2-methylindol-3-yl) phthalide, 4,4'-bis(dimethylamino) benzhydryl benzyl ether, N-halophenylleucoauramines, rhodamine-B-anilinolactam, rhodamine-B-(p-chloroanilino) lactam, 2-benzylamino-6-diethylaminofluorene, 2-anilino-6-diethylaminofluorene, 2-anilino-3-methyl-6-cyclohexylmethylaminofluorene, 2-anilino-3-methyl-6-isoamylethylaminofluorene, 2-(o-chloroanilino)-6-diethylaminofluorene, 2-octylamino-6-diethylaminofluorene, 2-ethoxyethylamino-3-chloro-2-diethylaminofluorene, 2-anilino-3-chloro-6-diethylaminofluorene, benzoylleucomethylene blue, p-nitrobenzylleucomethylene blue, 3-methyl-spiro-dinaphthopyran, 3-ethyl-spiro-dinaphthopyran, 3,3'-dichloro-spiro-dinaphthopyran, 3-benzylpyrodinaphthopyran, 3-propyl-spiro-dibenzopyran, etc.

The electron-accepting compound includes phenol derivatives such as bisphenols, etc., as well as salicylic acid derivatives, hydroxybenzoate derivatives, etc. Of those, preferred are bisphenols and hydroxybenzoates. Specifically, the compounds include 2,2-bis (p-hydroxyphenyl) propane, 2,2-bis (p-hydroxyphenyl) pentane, 2,2-bis (p-hydroxyphenyl) ethane, 2,2-bis (p-hydroxyphenyl) butane, 2,2-bis (4'-hydroxy-3',5'-dichlorophenyl) propane, 1,1-bis (p-hydroxyphenyl) cyclohexane, 1,1-bis (p-hydroxyphenyl) propane, 1,1-bis (p-hydroxyphenyl) pentane, 1,1-bis (p-hydroxyphenyl)-2-ethylhexane, 3,5-di (α-methylbenzyl) salicylic acid and its polyvalent metal salts, 3,5-du (t-butyl) salicylic acid and its polyvalent metal salts, 3-α,α-dimethylbenzylsalicylic acid and its polyvalent metal salts, butyl p-hydroxybenzoate, benzyl p-hydroxybenzoate, 2-ethylhexyl p-hydroxybenzoate, p-phenylphenol, p-cumylphenol, etc. For use in the invention, two or more of these electron-donating compounds may be combined in any desired ratio.

As the color development promoter for use herein, preferred are low-melting-point organic compounds having both an aromatic group and a polar group to a suitable degree in the molecule. For example, the compounds include benzyl p-benzyloxybenzoate, α-naphthyl benzyl ether, β-naphthyl benzyl ether, phenyl β-naphthoate, phenyl α-hydroxy-β-naphthoate, β-naphthol (p-chlorobenzyl) ether, 1,4-butanediol phenyl ether, 1, 4-butanediol p-methylphenyl ether, 1,4-butanediol p-ethylphenyl ether, 1,4-butanediol m-methylphenyl ether, 1-phenoxy-2-(p-tolyloxy) ethane, 1-phenoxy-2-(p-ethylphenoxy) ethane, 1-phenoxy-2-(p-chlorophenoxy) ethane, p-benzylbiphenyl, etc. For use in the invention, two or more of this color development promoters may be combined in any desired ratio.

In the heat and light-sensitive recording material of the invention, the dye precursor and any one of coupler and/or basic substance serving as a developer shall be separated in different sites to attain the intended effect of the invention. Therefore, various types of multicore-multiplex microcapsules are employable in the invention.

Figure 6A:
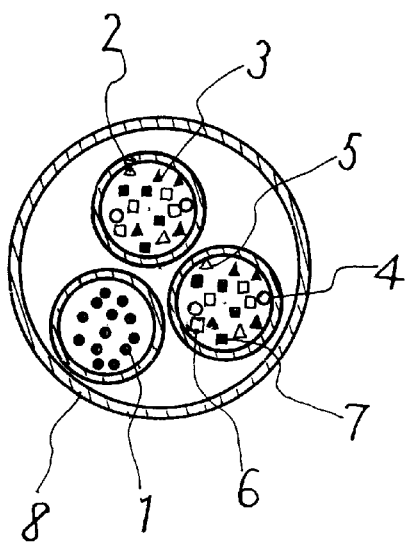
FIG. 6a to FIG. 6d are graphic views showing models of the microcapsules for use in the invention.

FIG. 6a to FIG. 6d, and FIG. 7a and FIG. 7b show different models of multicore-multiplex microcapsules employable in the invention. Precisely, FIG. 6a shows one model of the multicore-multiplex microcapsules usable herein, in which the heat-responsive resin layer 2 of one sub-microcapsule envelops a diazonium salt 1, and the heat-responsive resin layer 2 of the other sub-microcapsules envelops a coupler 3, a wavelength-dependent sensitizer 4, a photo-polymerization initiator 5, a polymerizing substance 6 and a basic substance 7.

Figure 6B:
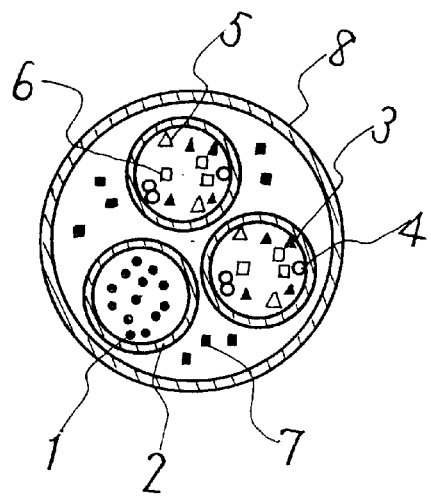

FIG. 6b shows another model of the multicore-multiplex microcapsules usable herein, in which the heat-responsive resin layer 2 of one sub-microcapsule envelops a diazonium salt 1, the heat-responsive resin layer 2 of the other sub-microcapsules envelops a coupler 3, a wavelength-dependent sensitizer 4, a photo-polymerization initiator 5 and a polymerizing substance 6, and the shell contains a basic substance 7.

Figure 6C:
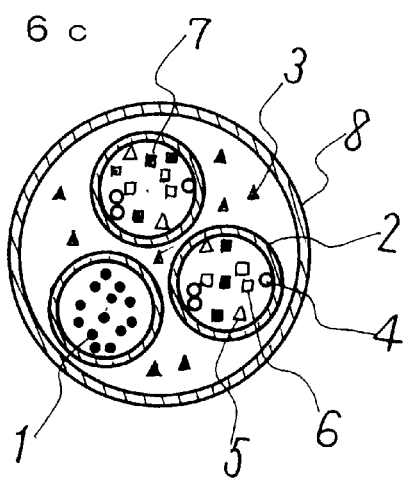

FIG. 6c shows still another model of the multicore-multiplex microcapsules usable herein, in which the heat-responsive resin layer 2 of one sub-microcapsule envelops a diazonium salt 1, the heat-responsive resin layer 2 of the other sub-microcapsules envelops a wavelength-dependent sensitizer 4, a photo-polymerization initiator 5, a polymerizing substance 6 and a basic substance 7, and the shell contains a coupler 3.

Figure 6D:
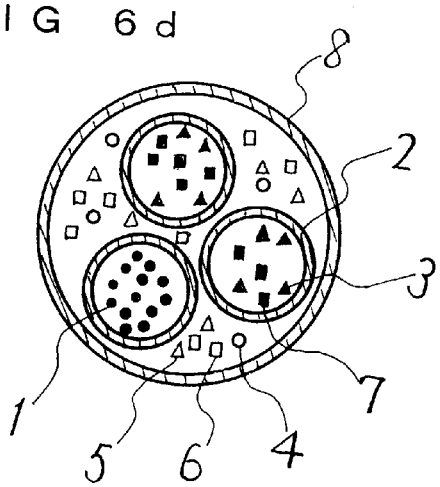

FIG. 6d shows still another model of the multicore-multiplex microcapsules usable herein, in which the heat-responsive resin layer 2 of one sub-microcapsule envelops a diazonium salt 1, the heat-responsive resin layer 2 of the other sub-microcapsules envelops a coupler 3 and a basic substance 7, and the shell contains a wavelength-dependent sensitizer 4, a photo-polymerization initiator 5 and a polymerizing substance 6.

In the heat and light-sensitive recording material of the invention, the photosensitivity of plural microcapsules for forming different colors may often overlap with each other. Such photosensitivity overlapping in that case is often problematic; as the white background area will be stained or the images formed could not have good color tone. To overcome the problem, therefore, it is desirable to make an optical filter substance exist inside the microcapsules or in the outermost wall of each microcapsule. The optical filter substance can selectively absorb light falling within a specific wavelength range.

Figure 7A:
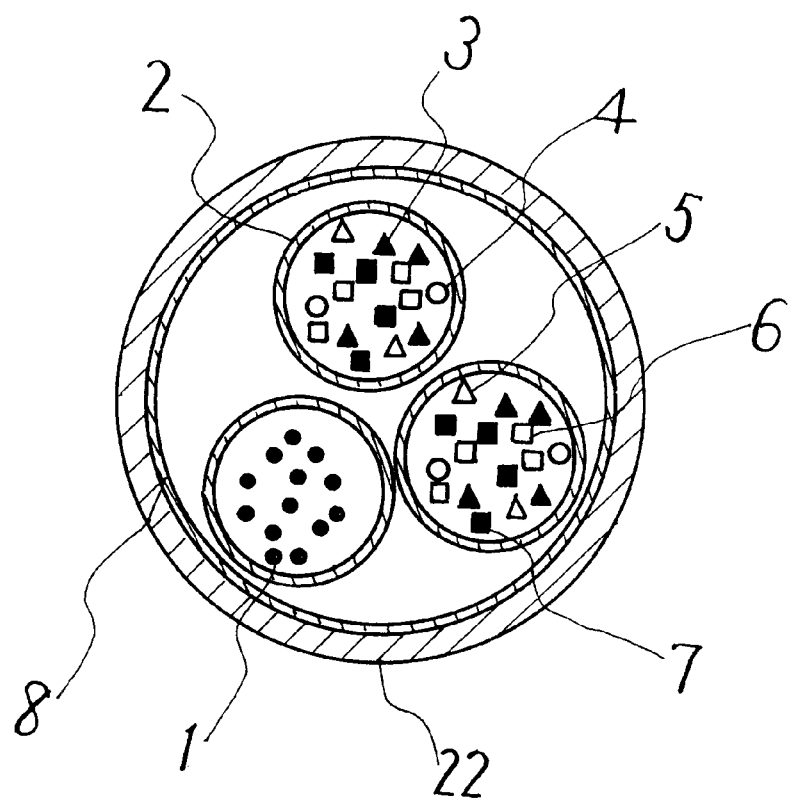
FIG. 7a and FIG. 7b are graphic views showing models of the microcapsules for use in the invention.

FIG. 7a shows one model of multicore-multiplex microcapsules of that type, in which the heat-responsive resin layer 2 of one sub-microcapsule envelops a diazonium salt 1, the heat-responsive resin layer 2 of the other sub-microcapsules envelops a coupler 3, a wavelength-dependent sensitizer 4, a photo-polymerization initiator 5, a polymerizing substance 6 and a basic substance 7, and the wall 8 of the microcapsule is covered with an optical filter 22.

The optical filter substance usable in the heat and light-sensitive recording material of the invention includes, for example, acrylorange dyes, benzofuran dyes, merocyanine dyes, xanthene dyes, cyanine dyes, thiazine dyes, azine dyes, methine dyes, oxazine dyes, phenylmethane dyes, azo dyes, anthraquinone dyes, pyrazoline dyes, stilbene dyes, quinoline dyes, rhodamine dyes, safranine dyes, malachite green dyes, methylene blue dyes, coumarin dyes, squalilium dyes, etc.

Figure 8:
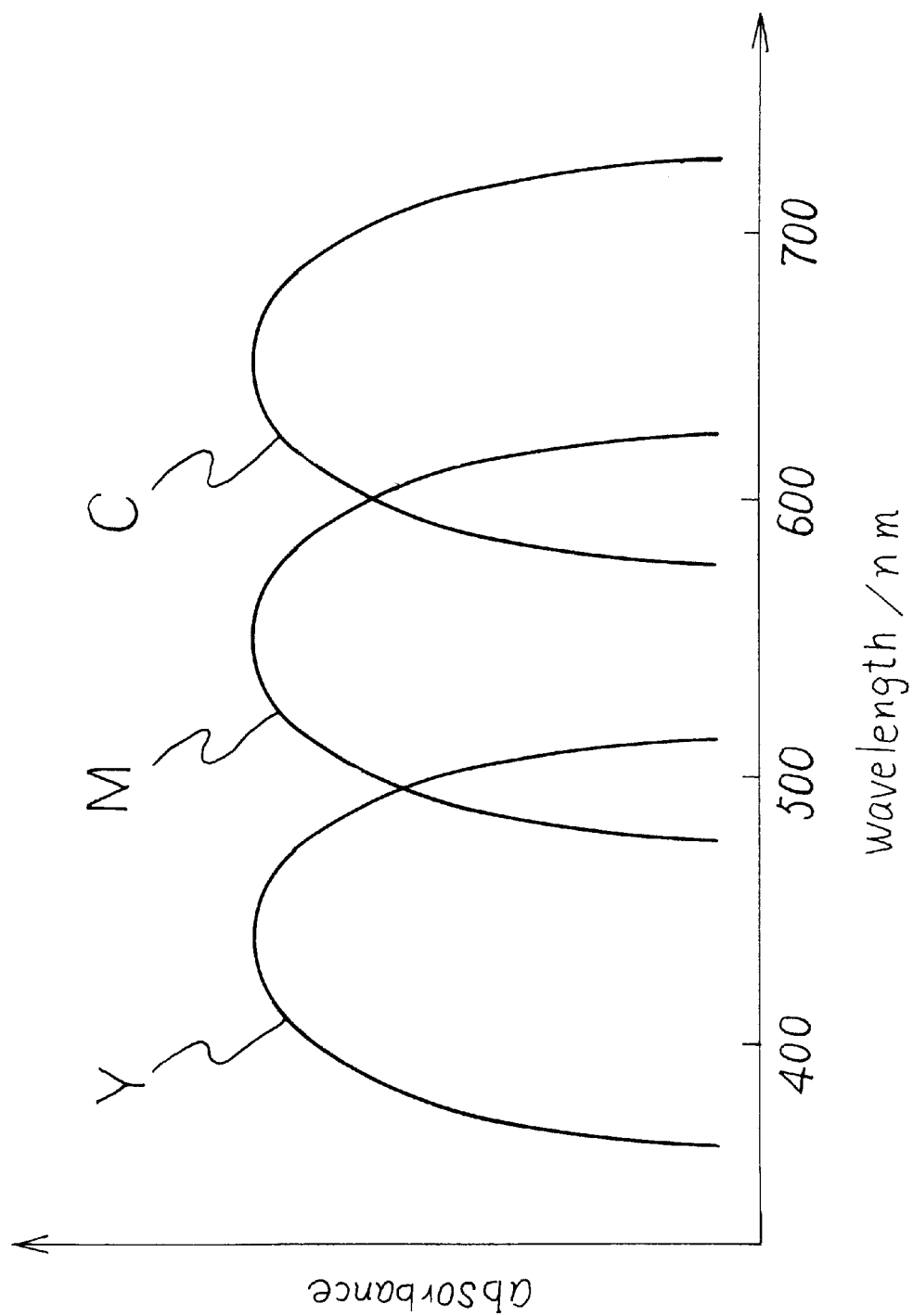
FIG. 8 is a graph showing the photosensitivity characteristics of three microcapsules for Y, M and C colors.
Figure 9:
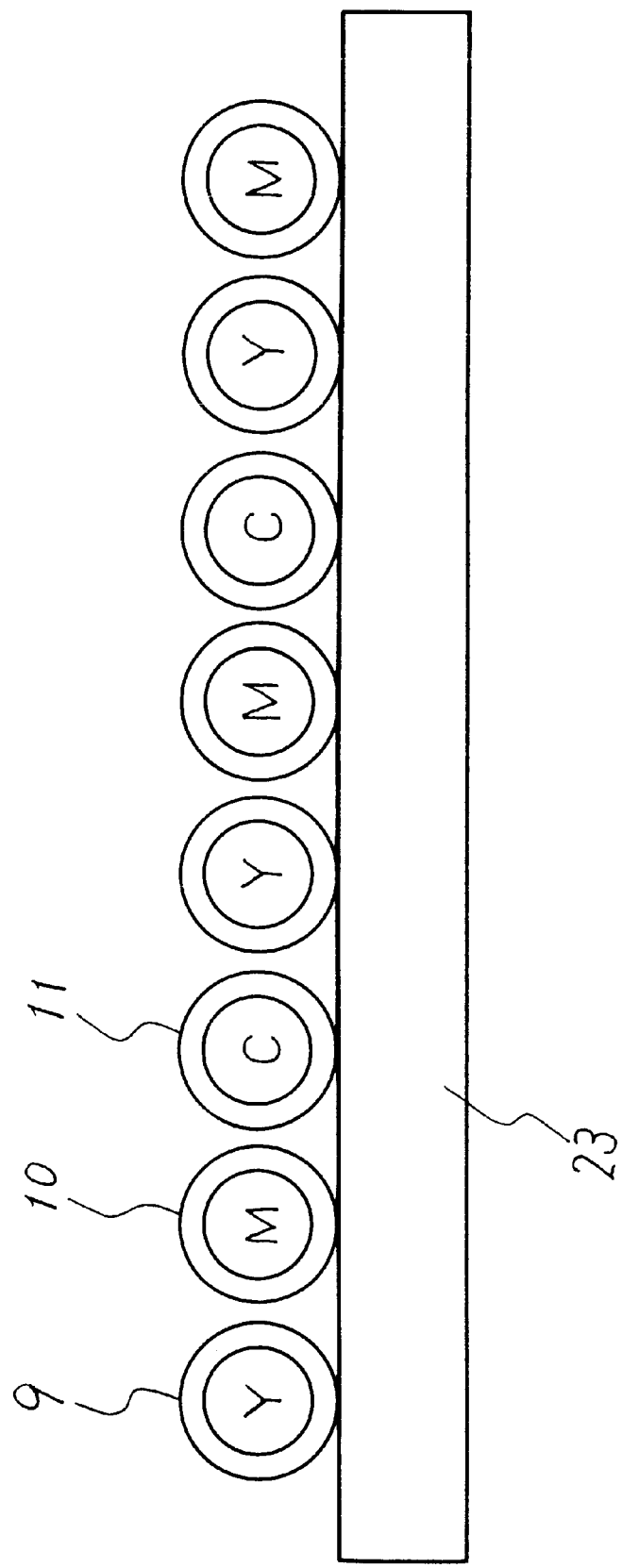
FIG. 9 is a graphic view showing one embodiment of the heat and light-sensitive recording material of the invention, which comprises the microcapsules of any of FIGS. 1a, 1b through FIGS. 7a, 7b.
Figure 10A:
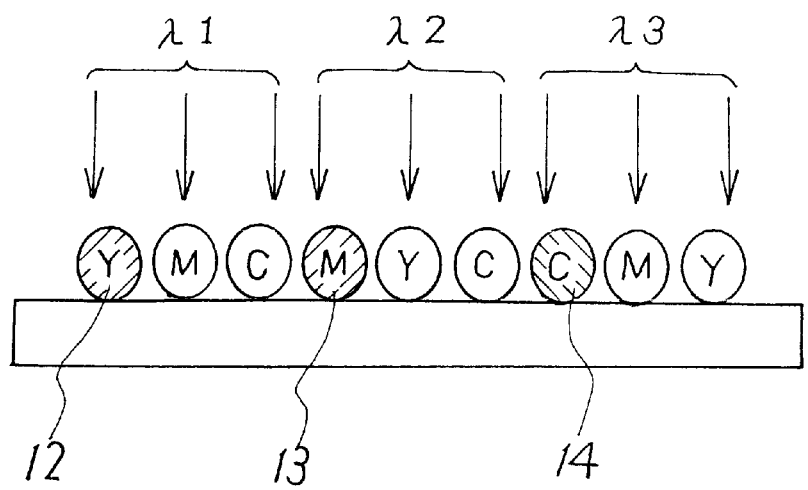
FIG. 10a and FIG. 10b are graphic views indicating a recording method with the heat and light-sensitive recording material of FIG. 9.
Figure 10B:
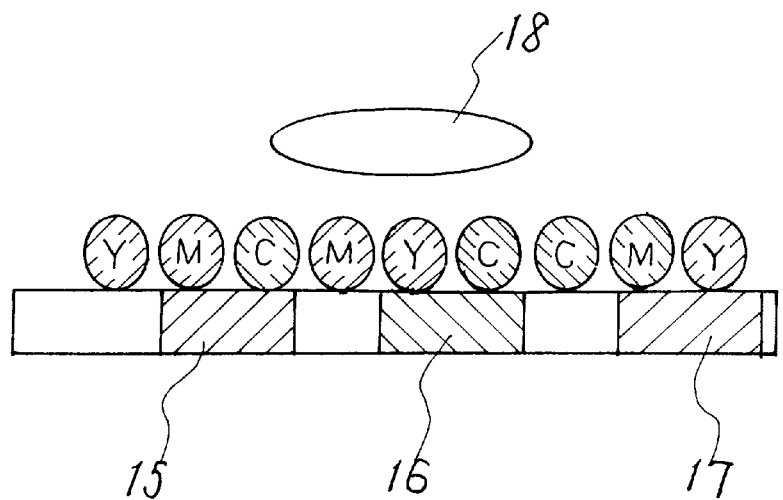
Figure 11A:
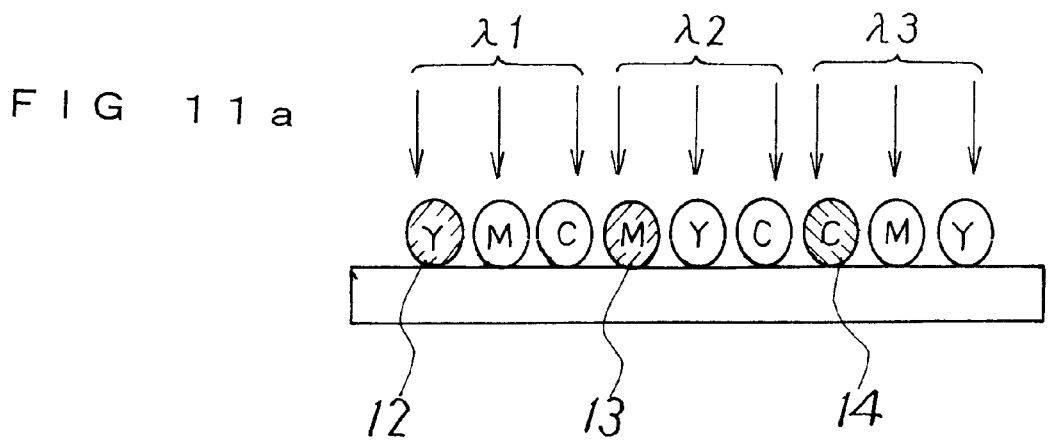
FIGS. 11a, 11b and 11c are graphic views indicating a recording method with the heat and light-sensitive recording material of FIG. 9.
Figure 11B:
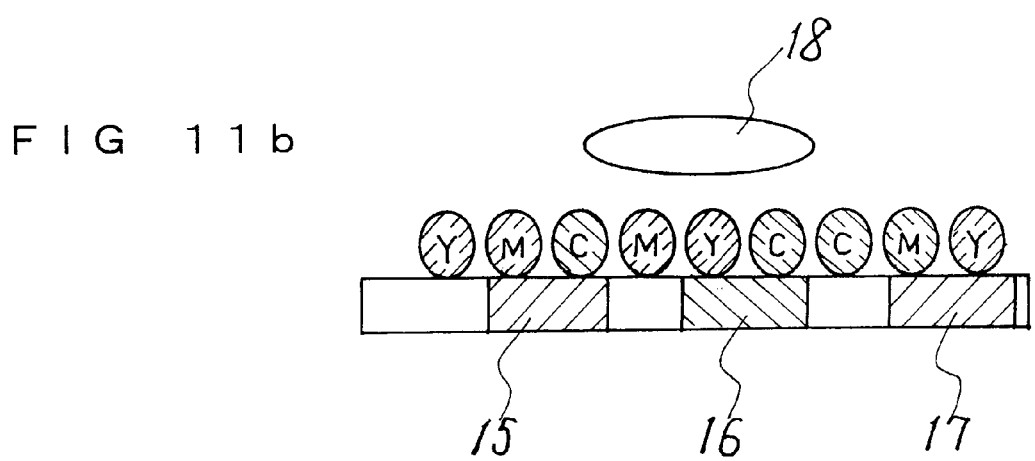
Figure 11C:
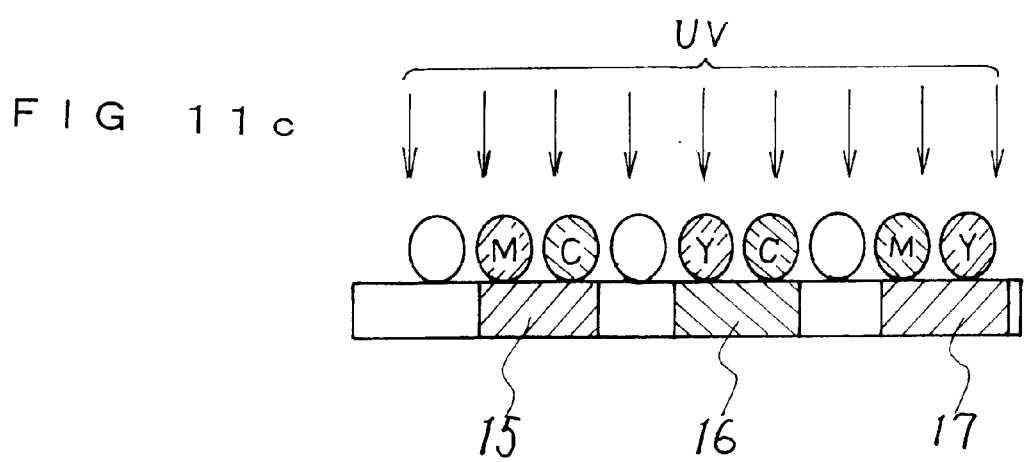

FIG. 8 is a graph showing one example of the photosensitivity characteristics of the heat and light-sensitive recording material of the invention. For the full-color imaging medium that contains three different types of microcapsules for Y, M and C colors each having the photosensitivity characteristic as in FIG. 8, an optical filter substance capable of absorbing or reflecting light of 500 nm or longer may be applied to the yellow (Y) microcapsules; an optical filter substance capable of absorbing or reflecting light of 500 nm or shorter may be to the magenta (M) microcapsules; and an optical filter substance capable of absorbing or reflecting light of 600 nm or shorter may be to the cyan (C) microcapsules.

It is desirable that the amount of the optical filter substance to be added falls between 0.01 and 20% by weight of the wall material of each microcapsule. If its amount is smaller than 0.01% by weight, the optical filter substance could not fully exhibit its filter function; but if larger than 20% by weight, the microcapsules themselves will be unfavorably colored to such a degree that they are visible by themselves.

Figure 7B:
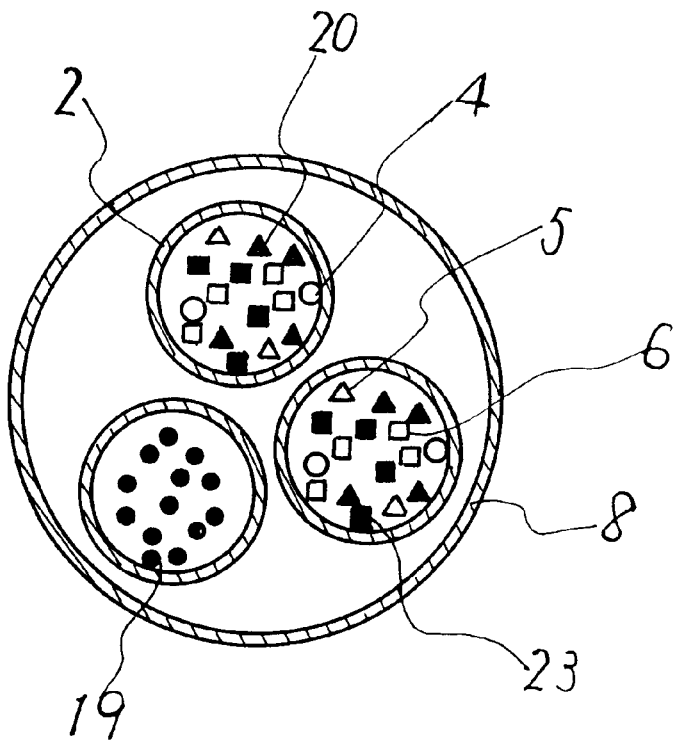

FIG. 7b shows another model of multicore-multiplex microcapsules, in which the heat-responsive resin layer 2 of one sub-microcapsule envelops a diazonium salt 1, and the heat-responsive resin layer 2 of the other sub-microcapsules envelops a wavelength-dependent sensitizer 4, a photo-polymerization initiator 5, a polymerizing substance 6, a developer (electron-accepting compound) 20 and a heat-sensitizer 23.

For producing such multicore and/or multiplex microcapsules, for example, inclusions for sub-microcapsules and those for outer microcapsules are mixed and encapsulated through in-situ polymerization or through coacervation into multicore and/or multiplex microcapsules.

In the heat and light-sensitive recording material of the invention, citric acid or tartaric acid may be added to the microcapsules so as to prevent spontaneous decomposition of the diazonium salt therein.

In the heat and light-sensitive recording material of the invention, it is desirable that the size of the heat-responsive submicrocapsules (this indicates the diameter of the circular heat-responsive resin layer that envelops the core) falls between 0.1 and 5 μm. If the size is smaller than 0.1 μm, the production costs will increase; but if larger than 5 μm, the image resolution will be lowered.

For the multicore-multiplex microcapsules, it is desirable that their size falls between 0.5 and 100 μm. If the size is smaller than 0.5 μm, the production costs will increase; but if larger than 100 μm, the image resolution will be lowered. The heat-responsive sub-microcapsule content of one multicore-multiplex microcapsule may fall between 5 and 80% by weight, but preferably between 30 and 60% by weight. If the content is smaller than 5% by weight or larger than 80% by weight, the microcapsules are difficult to produce through encapsulation.

The microcapsules produced in the manner noted above are mixed with a liquid containing a binder resin such as polyvinyl alcohol or the like, and the resulting liquid mixture is applied onto a support, or a support is immersed in it, whereby is obtained the heat and light-sensitive recording material of the invention.

To form a layer of the microcapsules-containing liquid on a support, for example, employable is a bar coater, a roll coater, a blade coater, an air-knife coater or the like.

The support for the heat and light-sensitive recording material of the invention include, for example, paper such as ordinary paper, high-quality paper, coated paper, etc.; films of polyesters, polyethylenes, polypropylenes, acetyl celluloses, polyvinyl acetals, polystyrenes, polycarbonates, polyethylene terephthalates, polyimides or the like; and also synthetic paper of resins or of a combination of resin and paper. Of those, preferred are polyethylene terephthalate films, as having high surface smoothness and high strength; and especially preferred are those of which one surface is coated with a reflective layer formed through aluminium vapor deposition or the like, as having the ability to enhance the photosensitivity of the microcapsules-containing layer formed thereon.

In the heat and light-sensitive recording material of the invention, the microcapsules-containing photosensitive layer may be covered with a protective layer so as to improve the light-fastness of the material.

The protective layer for the heat and light-sensitive recording material of the invention may be made of any ordinary polymer material, for which preferred are water-soluble or hydrophobic polymer emulsions.

FIG. 9, FIGS. 10A and 10B, and FIGS. 11A, 11B and 11C are graphic views showing the constitution of the heat and light-sensitive recording material of the invention. In those, 9 indicates an yellow color forming microcapsule; 10 indicates a magenta color forming microcapsule; 11 indicates a cyan color forming microcapsule; 12 indicates a cured, yellow color forming microcapsule; 13 indicates a cured, magenta color forming microcapsule; 14 indicates a cured, cyan color forming microcapsule; 15 indicates a blue (B) color area; 16 indicates a green (G) color area; 17 indicates a red (R) color area; 18 indicates heating energy; and 23 indicates a support.

The invention is described in more detail with reference to the following Examples, which, however, are not intended to restrict the scope of the invention.

EXAMPLE 1

1) Preparation of Heat-responsive Microcapsules with Inclusion of Diazonium Salt (Core and Heat-responsive Resin Layer):

3 parts by weight of 4-(4'-methylphenylthio)-2,5-diethoxybenzene-diazonium hexafluorophosphate (DH-575PF6 from Daito Chemics) and 3 parts by weight of dibutyl sulfate were dissolved in 10 parts by weight of ethyl acetate, with heating them in some degree, and 6 parts by weight of isopropylbiphenyl was added thereto and mixed uniformly.

Next, 8 parts by weight of a wall-forming material, Takenate D-110N (from Takeda Chemical Industries) was added to the resulting liquid mixture, and mixed uniformly to prepare a liquid A.

Apart from the above, 64 parts by weight of an aqueous solution of 6 wt. % gelatin, to which had been added 0.2 parts by weight of n-octylglucoside (Scuraph AG-8 from Nippon Seika), was prepared. To this was added the liquid A prepared previously, and the resulting mixture was homogenized for 10 minutes by the use of a homogenizer driven at 10,000 rpm. To the resulting emulsion, added was 20 parts by weight of water, and this was further homogenized. With stirring at 40° C., this was subjected to encapsulation for 3 hours. Next, 6.5 parts by weight of an ion-exchange resin, Amberlite IRA67 (from Organo) and 13 parts by weight of an ion-exchange resin, Amberlite IRC50 (from Organo) were added thereto at 30° C., and further stirred for 1 hour. Next, the ion-exchange resins were removed through filtration to obtain a liquid containing microcapsules. This liquid was centrifuged to separate the microcapsules, which were then dried. Thus were obtained dry microcapsules C, which had a mean particle size of 0.5 μm.

2) Preparation of Cyan Color Forming Microcapsules 1:

To 100 parts by weight of a 3:4 mixture of polyethylene glycol diacrylate and dipentaerythritol hexaacrylate (this is a matrix for shell), added were 8 parts by weight of the microcapsules C prepared previously, 10 parts of a coupler, 2-hydroxynaphthalene-3-carboxy-2'-methylaniline (Daito Grounder OL from Daito Chemics), 3 parts by weight of a basic substance, triphenylguanidine, 0.5 parts by weight of a wavelength-dependent sensitizing dye, squalilium, and 3 parts by weight of a photo-polymerization initiator, (η5-2, 4-cyclopentadien-1-yl)[(1,2,3,4,5,6-η)-(1-methylethyl) benzene]iron(1+) hexafluorophosphate(1−). The resulting mixture was heated at 50° C. for 10 minutes to obtain a hydrophobic liquid component D.

Next, the liquid component D was added to an emulsifier, 1:1 mixed aqueous solution of an aqueous solution of 5 wt. % polystyrenesulfonic acid (as its partial sodium salt) and an aqueous solution of 5 wt. % styrene-maleic anhydride copolymer, and homogenized for 10 minutes by the use of a homogenizer driven at 8,000 rpm to prepare an O/W emulsion.

Apart from the above, melamine powder was added to an aqueous solution of 37% formaldehyde. This was controlled to have a pH of 9 with an aqueous solution of sodium hydroxide added thereto, and then heated at 60° C. for 30 minutes to obtain a melamine-formaldehyde prepolymer (this is a shell-coating resin).

The melamine-formaldehyde prepolymer was added to the OW emulsion prepared previously, and kept heated at 60° C. for 10 hours with stirring, and the resulting mixture was controlled to have a pH of 7. Thus was produced cyan color forming microcapsules 1 having a photosensitivity at around 650 nm? The size of the microcapsules fell between 1 and 3 μm.

3) Preparation of Magenta Color Forming Microcapsules 1:

Magenta color forming microcapsules 1 having a photosensitivity at around 550 nm were produced according to the same method as that for producing the cyan color forming microcapsules 1 as above. In this, however, p-N,N-di-n- pentylamino-3-butoxybenzene-diazonium hexafluorophosphate was used in place of the diazonium salt, 4-(4'-methylphenylthio)-2,5-diethoxybenzene-diazonium hexafluorophosphate used in producing the cyan color forming microcapsules 1; compound 1 was used as the coupler in place of 2-hydroxynaphthalene-3-carboxy-2'-methylaniline; and a cyanine dye was used as the wavelength-dependent sensitizing dye in place of squalilium. The size of the microcapsules produced herein fell between 1 and 3 μm.

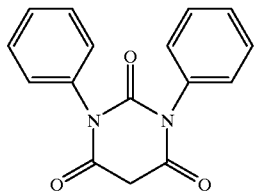

4) Preparation of Yellow Color Forming Microcapsules 1:

Yellow color forming microcapsules 1 having a photosensitivity at around 450 nm was produced according to the same method as that for producing the cyan color forming microcapsules 1 as above. In this, however, compound 2 was used as the coupler in place of 2-hydroxynaphthalene-3-carboxy-2'-methylaniline; and a coumarin dye were used as the wavelength-dependent sensitizing dye in place of squalilium. The size of the microcapsules produced herein fell between 1 and 3 μm.

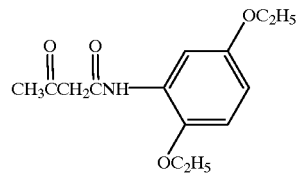

5) Production of Recording Medium:

Three types of microcapsules, the cyan color forming microcapsules 1, the yellow color forming microcapsules 1 and the magenta color forming microcapsules 1 all prepared previously (these are 20 parts by weight each) were mixed with 30 parts by weight of an aqueous solution of 20% polyvinyl alcohol serving as a binder resin to prepare a coating liquid. This was applied onto a 188 μm-thick PET film with a bar coater to form thereon a photosensitive layer having a dry thickness of 12 μm. In the full-color recording medium thus produced herein, the microcapsules constituting the photosensitive layer had the constitution like in FIG. 1a and FIG. 1b.

Next, the full-color recording medium was subjected to an imaging test, in which was used LED for emitting R, G and B colors for image signals. In the imaging test, the recording medium was exposed to light (0.2 mJ/mm$^2$ for each color) from LED, and then heated with a roller at 120° C. for 2 seconds to form a full-color image thereon (see FIG. 10a and FIG. 10b). In this stage, the full-color image formed on the medium was sharp and vivid.

EXAMPLE 2

1) Preparation of Heat-responsive Microcapsules with Inclusion of Coupler and Diazonium Salt (Core and Heat-responsive Resin Layer):

10 parts by weight of a coupler, 2-hydroxynaphthalene-3-carboxy-2'-methylaniline (Daito Grounder OL from Daito Chemics) and 2 parts by weight of a basic substance, triphenylguanidine were dissolved in 10 parts by weight of ethyl acetate, with heating them in some degree, and 6 parts by weight of isopropylbiphenyl was added thereto and mixed uniformly.

Next, 8 parts by weight of a wall-forming material, Takenate D-110N (from Takeda Chemical Industries) was added to the resulting liquid mixture, and mixed uniformly to prepare a liquid A.

Apart from the above, 64 parts by weight of an aqueous solution of 6 wt. % gelatin, to which had been added 0.2 parts by weight of n-octylglucoside (Scuraph AG-8 from Nippon Seika), was prepared. To this was added the liquid A prepared previously, and the resulting mixture was homogenized for 10 minutes by the use of a homogenizer driven at 10,000 rpm. To the resulting emulsion, added was 20 parts by weight of water, and this was further homogenized. With stirring at 40° C., this was subjected to encapsulation for 3 hours. This liquid was centrifuged to separate the microcapsules, which were then dried. Thus were obtained dry microcapsules C, which had a mean particle size of 0.5 μm.

2) Preparation of Cyan Color Forming Microcapsules 2:

To 100 parts by weight of a 3:4 mixture of polyethylene glycol diacrylate and dipentaerythritol hexaacrylate, added were 8 parts by weight of the microcapsules C prepared previously (these contain coupler and basic substance), 3 parts by weight of a diazonium salt, 4-(4'-methylphenylthio)-2,5-diethoxybenzene-diazonium hexafluorophosphate (DH-575PF6 from Daito Chemics), 3 parts by weight of dibutyl sulfate, 0.5 parts by weight of a wavelength-dependent sensitizing dye, squalilium, and 3 parts by weight of a photo-polymerization initiator, (η5-2,4-cyclopentadien-1-yl)[(1,2,3,4,5,6-η)-(1-methylethyl)benzene]iron(1+) hexafluorophosphate(1−). The resulting mixture was heated at 50° C. for 10 minutes to obtain a hydrophobic liquid component.

Next, the liquid component was added to an emulsifier, 1:1 mixed aqueous solution of an aqueous solution of 5 wt. % polystyrenesulfonic acid (as its partial sodium salt) and an aqueous solution of 5 wt. % styrene-maleic anhydride copolymer, and homogenized for 10 minutes by the use of a homogenizer driven at 8,000 rpm to prepare an O/W emulsion.

Apart from the above, melamine powder was added to an aqueous solution of 37% formaldehyde. This was controlled to have a pH of 9 with an aqueous solution of sodium hydroxide added thereto, and then heated at 60° C. for 30 minutes to obtain a melamine-formaldehyde prepolymer.

The melamine-formaldehyde prepolymer was added to the O/W emulsion prepared previously, and kept heated at 60° C. for 10 hours with stirring, and the resulting mixture was controlled to have a pH of 7. Thus were produced cyan color forming microcapsules 2 having a photosensitivity at around 650 nm. The size of the microcapsules fell between 1 and 3 μm.

3) Production of Recording Medium:

Three types of microcapsules, the cyan color forming microcapsules 2, the yellow color forming microcapsules 1 and the magenta color forming microcapsules 1 all prepared previously (these are 20 parts by weight each) were mixed with 30 parts by weight of an aqueous solution of 20% polyvinyl alcohol serving as a binder resin to prepare a coating liquid. This was applied onto a 188 μm-thick PET film with a bar coater to form thereon a photosensitive layer having a dry thickness of 12 μm. In the full-color recording medium thus produced herein, the microcapsules constituting the photosensitive layer had the constitution like in FIG. 2a and FIG. 2b.

Next, the full-color recording medium was subjected to an imaging test, in which was used LED for emitting R, G and B colors for image signals. In the imaging test, the recording medium was exposed to light (0.2 mJ/mm$^2$ for each color) from LED, and then heated with a roller at 120° C. for 2 seconds to form a full-color image thereon (see FIG. 10a and FIG. 10b). In this stage, the full-color image formed on the medium was sharp and vivid.

EXAMPLES 3 AND 4

The imaging test data of the full-color recording media of Examples 1 and 2 are analyzed herein. In the imaging test in which was used LED for emitting R, G and B colors for image signals, each recording medium was exposed to light (0.2 mJ/mm$^2$ for each color) from LED, and then heated with a roller at 120° C. for 2 seconds. Next, the thus-processed medium was exposed for 10 seconds to UV rays from an UV lamp (emission center: 365 nm, output: 40 W), whereby the image was fixed on the medium (see FIG. 11a to FIG. 11c). In this stage, the full-color image formed on the medium was sharp and vivid. Even after one month, the image did not change at all and was good.

EXAMPLE 5

1) Preparation of Heat-responsive Microcapsules with Inclusion of Diazonium Salt and Basic Compound (Core and Heat-responsive Resin Layer):

3 parts by weight of 4-(4'-methylphenylthio)-2,5-diethoxybenzene-diazonium hexafluorophosphate (DH-575PF6 from Daito Chemics), 1 part by weight of a basic substance, triphenylguanidine, and 3 parts by weight of dibutyl sulfate were dissolved in 10 parts by weight of ethyl acetate, with heating them in some degree, and 6 parts by weight of isopropylbiphenyl was added thereto and mixed uniformly. Next, 8 parts by weight of a wall-forming material, Takenate D-110N (from Takeda Chemical Industries) was added to the resulting liquid mixture, and mixed uniformly to prepare a liquid A.

Apart from the above, 64 parts by weight of an aqueous solution of 6 wt. % gelatin, to which had been added 0.2 parts by weight of n-octylglucoside (Scuraph AG-8 from Nippon Seika), was prepared. To this was added the liquid A prepared previously, and the resulting mixture was homogenized for 10 minutes by the use of a homogenizer driven at 10,000 rpm. To the resulting emulsion, added was 20 parts by weight of water, and this was further homogenized. With stirring at 40° C., this was subjected to encapsulation for 3 hours. Next, 6.5 parts by weight of an ion-exchange resin, Amberlite IRA67 (from Organo) and 13 parts by weight of an ion-exchange resin, Amberlite IRC50 (from Organo) were added thereto at 30° C., and further stirred for 1 hour. Next, the ion-exchange resins were removed through filtration to obtain a liquid containing microcapsules. This liquid was centrifuged to separate the microcapsules, which were then dried. Thus were obtained dry microcapsules C, which had a mean particle size of 0.5 µm.

2) Preparation of Cyan Color Forming Microcapsules 3:

To 100 parts by weight of a 3:4 mixture of polyethylene glycol diacrylate and dipentaerythritol hexaacrylate, added were 30 parts by weight of the microcapsules C prepared previously, 10 parts of a coupler, 2-hydroxynaphthalene-3-carboxy-2'-methylaniline (Daito Grounder OL from Daito Chemics), 0.5 parts by weight of a wavelength-dependent sensitizing dye, squalilium, and 3 parts by weight of a photo-polymerization initiator, (η5-2,4-cyclopentadien-1-yl)[(1,2,3,4,5,6-η)-(1-methylethyl) benzene] iron(1+) hexafluorophosphate (1−). The resulting mixture was heated at 50° C. for 10 minutes to obtain a hydrophobic liquid component D.

Next, the liquid component D was added to an emulsifier, 1:1 mixed aqueous solution of an aqueous solution of 5 wt. % polystyrenesulfonic acid (as its partial sodium salt) and an aqueous solution of 5 wt. % styrene-maleic anhydride copolymer, and homogenized for 10 minutes by the use of a homogenizer driven at 8,000 rpm to prepare an O/W emulsion.

Apart from the above, melamine powder was added to an aqueous solution of 37% formaldehyde. This was controlled to have a pH of 9 with an aqueous solution of sodium hydroxide added thereto, and then heated at 60° C. for 30 minutes to obtain a melamine-formaldehyde prepolymer.

The melamine-formaldehyde prepolymer was added to the O/W emulsion prepared previously, and kept heated at 60° C. for 10 hours with stirring, and the resulting mixture was controlled to have a pH of 7. Thus was produced cyan color forming microcapsules 1 having a photosensitivity at around 650 nm? The size of the microcapsules fell between 1 and 3 µm.

3) Preparation of Magenta Color Forming Microcapsules 2:

Magenta color forming microcapsules 1 having a photosensitivity at around 550 nm were produced according to the same method as that for producing the cyan color forming microcapsules 1 as above. In this, however, p-N,N-di-n-pentylamino-3-butoxybenzene-diazonium hexafluorophosphate was used in place of the diazonium salt, 4-(4'-methylphenylthio)-2,5-diethoxybenzene-diazonium hexafluorophosphate used in producing the cyan color forming microcapsules 1; compound 1 was used as the coupler in place of 2-hydroxynaphthalene-3-carboxy-2'-methylaniline; and a cyanine dye was used as the wavelength-dependent sensitizing dye in place of squalilium. The size of the microcapsules produced herein fell between 1 and 3 µm.

4) Preparation of Yellow Color Forming Microcapsules 2:

Yellow color forming microcapsules 1 having a photosensitivity at around 450 nm were produced according to the same method as that for producing the cyan color forming microcapsules 1 as above. In this, however, compound 2 was used as the coupler in place of 2-hydroxynaphthalene-3-carboxy-2'-methylaniline; and a coumarin dye were used as the wavelength-dependent sensitizing dye in place of squalilium. The size of the microcapsules produced herein fell between 1 and 3 µm.

5) Production of Recording Medium:

Three types of microcapsules, the cyan color forming microcapsules 3, the yellow color forming microcapsules 2 and the magenta color forming microcapsules 2 all prepared previously (these are 20 parts by weight each) were mixed with 30 parts by weight of an aqueous solution of 20% polyvinyl alcohol serving as a binder resin to prepare a coating liquid. This was applied onto a 188 µm-thick PET film with a bar coater to form thereon a photosensitive layer having a dry thickness of 12 µm. Thus was produced a full-color recording medium.

Next, the full-color recording medium was subjected to an imaging test, which is described below.

In the imaging test, used was LED for emitting R, G and B colors for image signals. The recording medium was exposed to light (0.2 mJ/mm$^2$ for each color) from LED, and then heated with a roller at 120° C. for 2 seconds to form a full-color image thereon (see FIG. 10a and FIG. 10b). In this stage, the full-color image formed on the medium was sharp and vivid.

EXAMPLE 6

1) Preparation of Heat-responsive Microcapsules with Inclusion of Coupler and Basic Substance (Core and Heat-responsive Resin Layer):

10 parts by weight of a coupler, 2-hydroxynaphthalene-3-carboxy-2'-methylaniline (Daito Grounder OL from Daito Chemics) and 2 parts by weight of a basic substance, triphenylguanidine were uniformly mixed with 38 parts by weight of a 3:4 mixture of polyethylene glycol diacrylate and dipentaerythritol hexaacrylate, 0.5 parts by weight of a wavelength-dependent sensitizing dye, squalilium, and 3 parts by weight of a photo-polymerization initiator, ($\eta$5-2,4-cyclopentadien-1-yl)[(1,2,3,4,5,6-$\eta$)-(1-methylethyl)benzene]iron(1+) hexafluorophosphate(1-), all added to the former two.

Next, 8 parts by weight of a wall-forming material, Takenate D-110N.(from Takeda Chemical Industries) was added to the resulting liquid mixture, and mixed uniformly to prepare a liquid A.

Apart from the above, 64 parts by weight of an aqueous solution of 6 wt. % gelatin, to which had been added 0.2 parts by weight of n-octylglucoside (Scuraph AG-8 from Nippon Seika), was prepared. To this was added the liquid A prepared previously, and the resulting mixture was homogenized for 10 minutes by the use of a homogenizer driven at 10,000 rpm. To the resulting emulsion, added was 20 parts by weight of water, and this was further homogenized. With stirring at 40° C., this was subjected to encapsulation for 3 hours. Next, 6.5 parts by weight of an ion-exchange resin, Amberlite IRA67 (from Organo) and 13 parts by weight of an ion-exchange resin, Amberlite IRC50 (from Organo) were added thereto at 30° C., and further stirred for 1 hour. Next, the ion-exchange resins were removed through filtration to obtain a liquid containing microcapsules. This liquid was centrifuged to separate the microcapsules, which were then dried. Thus were obtained dry microcapsules C, which had a mean particle size of 0.5 $\mu$m.

2) Preparation of Cyan Color Forming Microcapsules 4:

10 parts by weight of the microcapsules C prepared previously (these contain coupler and basic substance) and 3 parts by weight of a diazonium salt, 4-(4'-methylphenylthio)-2,5-diethoxybenzene-diazonium hexafluorophosphate (DH-575PF6 from Daito Chemics) were dissolved in 50 parts by weight of ethyl acetate with heating them in some degree, and 6 parts by weight of isopropylbiphenyl was added thereto. The resulting mixture was heated at 50° C. for 10 minutes to prepare a hydrophobic liquid component.

Next, the liquid component was added to an emulsifier, 1:1 mixed aqueous solution of an aqueous solution of 5 wt. % polystyrenesulfonic acid (as its partial sodium salt) and an aqueous solution of 5 wt. % styrene-maleic anhydride copolymer, and homogenized for 10 minutes by the use of a homogenizer driven at 8,000 rpm to prepare an O/W emulsion.

Apart from the above, melamine powder was added to an aqueous solution of 37% formaldehyde. This was controlled to have a pH of 9 with an aqueous solution of sodium hydroxide added thereto, and then heated at 60° C. for 30 minutes to obtain a melamine-formaldehyde prepolymer.

The melamine-formaldehyde prepolymer was added to the O/W emulsion prepared previously, and kept heated at 60° C. for 10 hours with stirring, and the resulting mixture was controlled to have a pH of 7. Thus were produced cyan color forming microcapsules 2 having a photosensitivity at around 650 nm. The size of the microcapsules fell between 1 and 3 $\mu$m.

3) Production of Recording Medium:

Three types of microcapsules, the cyan color forming microcapsules 4, the yellow color forming microcapsules 2 and the magenta color forming microcapsules 2 all prepared previously (these are 20 parts by weight each) were mixed with 30 parts by weight of an aqueous solution of 20% polyvinyl alcohol serving as a binder resin to prepare a coating liquid. This was applied onto a 188 $\mu$m-thick PET film with a bar coater to form thereon a photosensitive layer having a dry thickness of 12 $\mu$m. In the full-color recording medium thus produced herein, the microcapsules constituting the photosensitive layer had the constitution like in FIG. 2a and FIG. 2b.

EXAMPLE 7

The same process as in Example 1 was repeated, except that the color forming components for the cyan color forming microcapsules were changed to the following herein: Precisely, in place of the diazonium salt, herein used was an electron-donating dye precursor, 3-(o-methyl-p-diethylaminophenyl)-3-(1'-ethyl-2-methylindol-3-yl) phthalide; and in place of the base and the coupler, herein used was an electron-accepting compound, bisphenol P30. The others were all the same as in Example 1. In the full-color recording medium thus produced herein, the microcapsules had the constitution as in FIG. 5.

The full-color recording medium was subjected to an imaging test, in which was used LED for emitting R, G and B colors for image signals. In the imaging test, the recording medium was exposed to light (0.2 mJ/mm$^2$ for each color) from LED, and then heated with a roller at 120° C. for 2 seconds to form a full-color image thereon. In this stage, the full-color image formed on the medium was sharp and vivid (see FIG. 10a and FIG. 10b).

EXAMPLES 8 AND 9

The imaging test data of the full-color recording media of Examples 5 and 6 are analyzed herein. In the imaging test in which was used LED for emitting R, G and B colors for image signals, each recording medium was exposed to light (0.2 mJ/mm$^2$ for each color) from LED, and then heated with a roller at 120° C. for 2 seconds. Next, the thus-processed medium was exposed for 10 seconds to UV rays from an UV lamp (emission center: 365 nm, output: 40 W), whereby the image was fixed on the medium (see FIG. 11a to FIG. 11c). In this stage, the full-color image formed on the medium was sharp and vivid. Even after one month, the image did not change at all and was good.

EXAMPLE 10

1) Preparation of Heat-responsive Microcapsules with Inclusion of Diazonium Salt (Core and Heat-responsive Resin Layer):

3 parts by weight of 4-(4'-methylphenylthio)-2,5-diethoxybenzene-diazonium hexafluorophosphate (DH-575PF6 from Daito Chemics) and 3 parts by weight of dibutyl sulfate were dissolved in 10 parts by weight of ethyl acetate, and 6 parts by weight of isopropylbiphenyl was added thereto and mixed uniformly. Next, 8 parts by weight of xylene diisocyanate/trimethylolpropane adduct (Takenate D-110N from Takeda Chemical Industries) was added to the resulting liquid mixture, and mixed uniformly to prepare a liquid A.

Apart from the above, 64 parts by weight of an aqueous solution of 6 wt. % gelatin, to which had been added 0.2 parts by weight of n-octylglucoside (Scuraph AG-8 from Nippon Seika), was prepared. To this was added the liquid A prepared previously, and the resulting mixture was homogenized for 5 minutes by the use of a homogenizer driven at 8,000 rpm. To the resulting emulsion, added was 20 parts by weight of water. With stirring, this was heated up to 60° C. at a heating rate of 1° C./min, and subjected to encapsulation at 60° C. for 3 hours. Next, this was cooled to 35° C., and 6.5 parts by weight of an ion-exchange resin, Amberlite IRA67 (from Organo) and 13 parts by weight of an ion-exchange resin, Amberlite IRC50 (from Organo) were added thereto, and further stirred for 1 hour. Next, the ion-exchange resins were removed through filtration to obtain a liquid containing microcapsules. This liquid was centrifuged to separate the microcapsules, which were then washed with water and dried. Thus were obtained dry microcapsules C, which had a mean particle size of 0.5 μm.

2) Preparation of Heat-responsive Microcapsules with Inclusion of Coupler and Diazonium Salt (Core and Heat-responsive Resin Layer):

To 50 parts by weight of a 3:4 mixture of polyethylene glycol diacrylate and dipentaerythritol hexaacrylate, added were 10 parts by weight of a coupler, 2-hydroxynaphthalene-3-carboxy-2'-methylaniline (Daito Grounder OL from Daito Chemics), 3 parts by weight of a basic substance, triphenylguanidine, 0.5 parts by weight of a wavelength-dependent sensitizing dye, squalilium, and 3 parts by weight of a photo-polymerization initiator, (η5-2, 4-cyclopentadien-1-yl)[(1,2,3,4,5,6-η)-(1-methylethyl)benzene]iron(1+) hexafluorophosphate(1−). The resulting mixture was dissolved in 10 parts by weight of ethyl acetate with heating them in some degree. 5 parts by weight of isopropylbiphenyl was added thereto, and mixed under heat to give a uniform mixture. After the mixture was cooled, 8 parts by weight of xylene diisocyanate/trimethylolpropane adduct (Takenate D-110N from Takeda Chemical Industries) was added thereto, and mixed uniformly to prepare a liquid B.

Apart from the above, 64 parts by weight of an aqueous solution of 6 wt. % gelatin, to which had been added 0.2 parts by weight of n-octylglucoside (Scuraph AG-8 from Nippon Seika), was prepared. To this was added the liquid B prepared previously, and the resulting mixture was homogenized for 5 minutes by the use of a homogenizer driven at 8,000 rpm. To the resulting emulsion, added was 20 parts by weight of water. With stirring, this was heated up to 60° C. at a heating rate of 1° C./min, and subjected to encapsulation at 60° C. for 3 hours. After cooled, this gave a microcapsules-containing liquid B. The microcapsules thus formed had a mean particle size of 1 μm.

3) Preparation of Cyan Color Forming Microcapsules 5:

To the microcapsules-containing liquid B prepared previously, added were the diazonium salt-containing microcapsules C. The resulting microcapsules-containing mixture was added to and mixed with an emulsifier, 1:1 mixed aqueous solution of an aqueous solution of 5 wt. % polystyrenesulfonic acid (as its partial sodium salt) and an aqueous solution of 5 wt. % styrene-maleic anhydride copolymer, with stirring, to prepare a microcapsules-containing liquid D.

Apart from the above, melamine powder was added to an aqueous solution of 37% formaldehyde. This was controlled to have a pH of 9 with an aqueous solution of sodium hydroxide added thereto, and then heated at 60° C. for 30 minutes to obtain a melamine-formaldehyde prepolymer. To this was added the microcapsules-containing liquid D, and stirred at 60° C. for 10 hours. The resulting mixture was then controlled to have a pH of 7 with a solution of acetic acid added thereto. Thus were produced cyan colors forming microcapsules having a photosensitivity at around 650 nm? The size of the microcapsules fell between 1 and 10 μm.

4) Preparation of Magenta Color Forming Microcapsules 3:

Magenta color forming microcapsules having a photosensitivity at around 550 nm were produced according to the same method as that for producing the cyan color forming microcapsules as above. In this, however, p-N,N-di-n-pentylamino-3-butoxybenzene-diazonium hexafluorophosphate was used in place of the diazonium salt, 4-(4'-methylphenylthio)-2,5-diethoxybenzene-diazonium hexafluorophosphate used in producing the cyan color forming microcapsules; compound 1 was used as the coupler in place of 2-hydroxynaphthalene-3-carboxy-2'-methylaniline; and a cyanine dye was used as the wavelength-dependent sensitizing dye in place of squalilium. The size of the microcapsules produced herein fell between 1 and 10 μm.

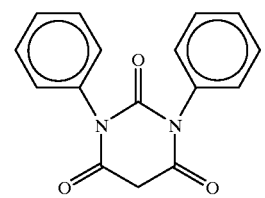

5) Preparation of Yellow Color Forming Microcapsules 3:

Yellow color forming microcapsules having a photosensitivity at around 450 nm were produced according to the same method as that for producing the cyan color forming microcapsules as above. In this, however, compound 2 was used as the coupler in place of 2-hydroxynaphthalene-3-carboxy-2'-methylaniline; and a coumarin dye was used as the wavelength-dependent sensitizing dye in place of squalilium. The size of the microcapsules produced herein fell between 1 and 3 μm.

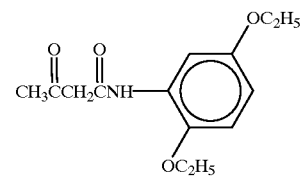

6) Production of Recording Medium:

Three types of microcapsules, the cyan color forming microcapsules 5, the yellow color forming microcapsules 3 and the magenta color forming microcapsules 3 all prepared previously (these are 20 parts by weight each) were mixed with 30 parts by weight of an aqueous solution of 20% polyvinyl alcohol serving as a binder resin to prepare a coating liquid. This was applied onto a 188 μm-thick PET film with a bar coater to form thereon a photosensitive layer having a dry thickness of 12 μm. In the full-color recording medium thus produced herein, the microcapsules constituting the photosensitive layer had the constitution like in FIG. 6a.

The full-color recording medium was subjected to an imaging test, in which was used LED for emitting R, G and B colors for image signals. In the imaging test, the recording medium was exposed to light (0.2 mJ/m² for each color) from LED, and then heated with a roller at 120° C. for 2 seconds to form a full-color image thereon. The full-color image formed on the medium was sharp and vivid.

EXAMPLE 11

1) Preparation of Heat-responsive Microcapsules with Inclusion of Diazonium Salt (Core and Heat-responsive Resin Layer):

3 parts by weight of 4-(4'-methylphenylthio)-2,5-diethoxybenzene-diazonium hexafluorophosphate (DH-575PF6 from Daito Chemics) and 3 parts by weight of dibutyl sulfate were dissolved in 10 parts by weight of ethyl acetate, and 6 parts by weight of isopropylbiphenyl was added thereto and mixed uniformly to prepare a liquid A.

Apart from the above, 64 parts by weight of an aqueous solution of 6 wt. % gelatin, to which had been added 6 parts by weight of a solution of 2% sodium dodecylbenzenesulfonate, was prepared. To this was added the liquid A prepared previously, and the resulting mixture was homogenized for 5 minutes by the use of a homogenizer driven at 8,000 rpm. The resulting emulsion was mixed with 64 parts by weight of an aqueous solution of 6% acacia at 40° C. To the mixture, added was 20 parts by weight of water at 40° C., and a few ml of an aqueous solution of 10% acetic acid was dropwise added thereto. Then, this was cooled down to 5° C., and a few ml of 30% formalin was added thereto. Having been controlled to have a pH of 9 with an aqueous solution of sodium hydroxide added thereto, this was heated up to 50° C. at a heating rate of 1° C./min, and then cooled down to room temperature. After having been thus processed, this was washed with water, and then dried to obtain diazonium salt-containing, heat-responsive microcapsules. The microcapsules had a mean particle size of 0.9 µm.

Using the microcapsules thus prepared herein, a full-color recording medium was produced in the same manner as in Example 10. The microcapsules in the medium produced herein all had the constitution as in FIG. 6a.

The full-color recording medium was subjected to an imaging test, in which was used LED for emitting R, G and B colors for image signals. In the imaging test, the recording medium was exposed to light (0.2 mJ/mm$^2$ for each color) from LED, and then heated with a roller at 120° C. for 2 seconds to form a full-color image thereon. The full-color image formed on the medium was sharp and vivid.

EXAMPLE 12

1) Preparation of Heat-responsive Microcapsules with Inclusion of Diazonium Salt (Core and Heat-responsive Resin Layer):

3 parts by weight of 4-(4'-methylphenylthio)-2,5-diethoxybenzene-diazonium hexafluorophosphate (DH-575PF6 from Daito Chemics) and 3 parts by weight of dibutyl sulfate were dissolved in 10 parts by weight of ethyl acetate, and 6 parts by weight of isopropylbiphenyl was added thereto and mixed uniformly.

Next, 8 parts by weight of xylene diisocyanate/trimethylolpropane adduct (Takenate D-110N from Takeda Chemical Industries) was added to the resulting liquid mixture, and mixed uniformly to prepare a liquid E.

Apart from the above, 64 parts by weight of an aqueous solution of 6 wt. % gelatin, to which had been added 0.2 parts by weight of n-octylglucoside (Scuraph AG-8 from Nippon Seika), was prepared. To this was added the liquid E prepared previously, and the resulting mixture was homogenized for 5 minutes by the use of a homogenizer driven at 8,000 rpm. To the resulting emulsion, added was 20 parts by weight of water. With stirring, this was heated up to 60° C. at a heating rate of 1° C./min, and subjected to encapsulation at 60° C. for 3 hours. After cooled, a microcapsules-containing liquid F was obtained. 6.5 parts by weight of an ion-exchange resin, Amberlite IRA67 (from Organo) and 13 parts by weight of an ion-exchange resin, Amberlite IRC50 (from Organo) were added to this at 30° C., and further stirred for 1 hour. Next, the ion-exchange resins were removed through filtration to separate the microcapsules-containing liquid F. The microcapsules formed had a mean particle size of 0.5 µm.

2) Preparation of Cyan Color Forming Microcapsules 6:

To 100 parts by weight of a 3:4 mixture of polyethylene glycol diacrylate and dipentaerythritol hexaacrylate, added were 8 parts by weight of the microcapsules C mentioned above, 10 parts by weight of a coupler, 2-hydroxynaphthalene-3-carboxy-2'-methylaniline (Daito Grounder OL from Daito Chemics), 3 parts by weight of a basic substance, triphenylguanidine, 0.5 parts by weight of a wavelength-dependent sensitizing dye, squalilium, and 3 parts by weight of a photo-polymerization initiator, ($\eta$5-2,4-cyclopentadien-1-yl)[(1,2,3,4,5,6-$\eta$)-(1-methylethyl)benzene]iron(1+) hexafluorophosphate(1-), and heated at 50° C. for 10 minutes to obtain a hydrophobic liquid component G. On the other hand, 180 parts by weight of an aqueous solution of 6 wt. % gelatin, to which had been added 6 parts by weight of a solution of 2% sodium dodecylbenzenesulfonate, was prepared. The liquid G was added to the gelatin solution, and homogenized for 10 minutes by the use of a homogenizer. 20 parts by weight of water was added to the resulting emulsion, to which were further added 6.5 parts by weight of an ion-exchange resin, Amberlite IRA67 (from Organo) and 13 parts by weight of an ion-exchange resin, Amberlite IRC50 (from Organo) at 35° C., and further stirred for 1 hour. Next, the ion-exchange resins were removed through filtration to obtain a microcapsules-containing liquid H.

Next, the microcapsules-containing liquids F and H were added to and uniformly mixed with an emulsifier, 1:1 mixed aqueous solution of an aqueous solution of 5 wt. % polystyrenesulfonic acid (as its partial sodium salt) and an aqueous solution of 5 wt. % styrene-maleic anhydride copolymer to prepare a microcapsules-containing liquid dispersion I.

Apart from the above, melamine powder was added to an aqueous solution of 37% formaldehyde. This was controlled to have a pH of 9 with an aqueous solution of sodium hydroxide added thereto, and then heated at 60° C. for 30 minutes to obtain a melamine-formaldehyde prepolymer. To this was added the microcapsules-containing liquid I, and stirred at 60° C. for 10 hours. The resulting mixture was then controlled to have a pH of 7 with acetic acid added thereto. Thus were produced cyan colors forming microcapsules 1 having a photosensitivity at around 650 nm? The size of the microcapsules fell between 1 and 3 µm.

3) Preparation of Magenta Color Forming Microcapsules 4:

Magenta color forming microcapsules 1 having a photosensitivity at around 550 nm were produced according to the same method as that for producing the cyan color forming microcapsules as above. In this, however, p-N,N-di-n-pentylamino-3-butoxybenzene-diazonium hexafluorophosphate was used in place of the diazonium salt, 4-(4'-methylphenylthio)-2,5-diethoxybenzene-diazonium hexafluorophosphate used in producing the cyan color forming microcapsules; compound 1 was used as the coupler in place of 2-hydroxynaphthalene-3-carboxy-2'-methylaniline; and a cyanine dye was used as the wavelength-dependent sensitizing dye in place of squalilium. The size of the microcapsules produced herein fell between 1 and 3 µm.

4) Preparation of Yellow Color Forming Microcapsules 4:

Yellow color forming microcapsules 1 having a photosensitivity at around 450 nm was produced according to the same method as that for producing the cyan color forming microcapsules as above. In this, however, compound 2 was used as the coupler in place of 2-hydroxynaphthalene-3-carboxy-2'-methylaniline; and a coumarin dye was used as the wavelength-dependent sensitizing dye in place of squalilium. The size of the microcapsules produced herein fell between 1 and 3 µl.

5) Production of Recording Medium:

Three types of microcapsules, the cyan color forming microcapsules 6, the yellow color forming microcapsules 4 and the magenta color forming microcapsules 4 all prepared previously (these are 20 parts by weight each) were mixed with 30 parts by weight of an aqueous solution of 20% polyvinyl alcohol serving as a binder resin to prepare a coating liquid. This was applied onto a 188 µm-thick PET film with a bar coater to form thereon a photosensitive layer having a dry thickness of 12 µm. In the full-color recording medium thus produced herein, the microcapsules constituting the photosensitive layer had the constitution like in FIG. 6*a*.

The full-color recording medium was subjected to an imaging test, in the manner mentioned below.

In the imaging test, used was LED for emitting R, G and B colors for image signals. The recording medium was exposed to light (0.2 mJ/mm$^2$ for each color) from LED, and then heated with a roller at 120° C. for 2 seconds to form a full-color image thereon. The full-color image formed on the medium was sharp and vivid.

EXAMPLE 13

1) Preparation of Heat-responsive Microcapsules with Inclusion of Diazonium Salt (Core and Heat-responsive Resin Layer):

0.1 parts by weight of 4-(4'-methylphenylthio)-2,5-diethoxybenzene-diazonium salt was dissolved in 0.4 parts by weight of pure water. The resulting aqueous solution is to be the aqueous phase in forming microcapsules in the following step. 5.3 parts by weight of xylene diisocyanate/trimethylolpropane adduct (Takenate D-110N from Takeda Chemical Industries; as a 75 wt. % solution in ethyl acetate) was dissolved in 8 parts by weight of methylene chloride. The resulting organic solvent solution is to be the oil phase in forming microcapsules in the following step. The aqueous solution prepared previously was dropwise added to this organic solvent solution being stirred by the use of a homogenizer, to prepare a W/O emulsion J.

2) Preparation of Cyan Color Forming Microcapsules 7:

3 parts by weight of a basic substance, guanidine trichloroacetate was dissolved in 3 parts by weight of pure water. On the other hand, 15 parts by weight of xylene diisocyanate/trimethylolpropane adduct (Takenate D-110N from Takeda Chemical Industries; as a 75 wt. % solution in ethyl acetate) was dissolved in 24 parts by weight of methylene chloride to prepare an organic solvent solution (this is to be an oil phase in the following step). The aqueous solution prepared previously was dropwise added to this organic solvent solution being stirred by the use of a homogenizer, to prepare a W/O emulsion K.

To 100 parts by weight of a 3:4 mixture of polyethylene glycol diacrylate and dipentaerythritol hexaacrylate, added were 8 parts by weight of the microcapsules C mentioned above, 10 parts by weight of a coupler, 2-hydroxynaphthalene-3-carboxy-2'-methylaniline (Daito Grounder OL from Daito Chemics), 0.5 parts by weight of a wavelength-dependent sensitizing dye, squalilium, and 3 parts by weight of a photo-polymerization initiator, (η5-2,4-cyclopentadien-1-yl)[(1,2,3,4,5,6-η)-(1-methylethyl)benzene]iron(1+) hexafluorophosphate(1−), and heated at 50° C. for 10 minutes to obtain a hydrophobic liquid component L. Next, the microcapsules-containing liquids J and K and the hydrophobic liquid L were mixed uniformly to prepare a microcapsules-containing liquid M. The liquid M was added to an emulsifier, 1:1 mixed aqueous solution of an aqueous solution of 5 wt. % polystyrenesulfonic acid (as its partial sodium salt) and an aqueous solution of 5 wt. % styrene-maleic anhydride copolymer, and homogenized for 5 minutes by the use of a homogenizer driven at 6,000 rpm, to prepare an emulsion N.

Apart from the above, melamine powder was added to an aqueous solution of 37% formaldehyde. This was controlled to have a pH of 9 with an aqueous solution of sodium hydroxide added thereto, and then heated at 60° C. for 30 minutes to obtain a melamine-formaldehyde prepolymer. The emulsion N was added to the prepolymer, and stirred at 60° C. for 10 hours. The resulting mixture was then controlled to have a pH of 7 with acetic acid added thereto. After cooled to room temperature, cyan color forming, multicore microcapsules having a photosensitivity at around 650 nm.

3) Preparation of Magenta Color Forming Microcapsules 5:

Magenta color forming microcapsules having a photosensitivity at around 550 nm were produced according to the same method as that for producing the cyan color forming microcapsules as above. In this, however, p-N,N-di-n-pentylamino-3-butoxybenzene-diazonium salt was used in place of the diazonium salt, 4-(4'-methylphenylthio)-2,5-diethoxybenzene-diazonium salt used in producing the cyan color forming microcapsules; compound 1 was used as the coupler in place of 2-hydroxynaphthalene-3-carboxy-2'-methylaniline; and a cyanine dye was used as the wavelength-dependent sensitizing dye in place of squalilium. The size of the microcapsules produced herein fell between 1 and 3 µm.

4) Preparation of Yellow Color Forming Microcapsules 5:

Yellow color forming microcapsules having a photosensitivity at around 450 nm were produced according to the same method as that for producing the cyan color forming microcapsules as above. In this, however, compound 2 was used as the coupler in place of 2-hydroxynaphthalene-3-carboxy-2'-methylaniline; and a coumarin dye was used as the wavelength-dependent sensitizing dye in place of squalilium. The size of the microcapsules produced herein fell between 1 and 3 µm.

5) Production of Recording Medium:

Three types of microcapsules, the cyan color forming microcapsules 7, the yellow color forming microcapsules 5 and the magenta color forming microcapsules 5 all prepared previously (these are 20 parts by weight each) were mixed with 30 parts by weight of an aqueous solution of 20% polyvinyl alcohol serving as a binder resin to prepare a coating liquid. This was applied onto a 188 µm-thick PET film with a bar coater to form thereon a photosensitive layer having a dry thickness of 12 µm. In the full-color recording medium thus produced herein, the microcapsules constituting the photosensitive layer had the constitution like in FIG. 6*a*.

The full-color recording medium was subjected to an imaging test, in the manner mentioned below.

In the imaging test, used was LED for emitting R, G and B colors for image signals. The recording medium was exposed to light (0.2 mJ/mm$^2$ for each color) from LED, and then heated with a roller at 120° C. for 2 seconds to form a full-color image thereon. The full-color image formed on the medium was sharp and vivid.

EXAMPLE 14

The same process as in Example 10 was repeated. In this, however, a minor amount of a cyanine dye capable of absorbing light of not longer than 600 nm was added to the melamine powder in the step of forming the shell wall for the cyan color forming microcapsules; a minor amount of a coumarin dye capable of absorbing light not longer than 500 nm was added thereto in preparing the magenta color forming microcapsules; and a minor amount of a cyanine dye capable of absorbing light not shorter than 500 nm was added thereto in preparing the yellow color forming microcapsules. With the dyes added, the cyan color forming microcapsules could absorb light not longer than 600 nm; the magenta color forming microcapsules could absorb light not longer than 500 nm; and the yellow color forming microcapsules could absorb light not shorter than 500 nm. Specifically, the dyes added herein-prevented color mixing in the recording medium exposed to rays of light in boundary wavelength regions. In the full-color recording medium produced herein, the microcapsules constituting the photosensitive layer had the constitution like in FIG. 7a. The medium was subjected to an imaging test. The full-color image formed on the medium was sharp and vivid with no blurred area, and had a high density with good full-color tone.

EXAMPLE 15

The same process as in Example 10 was repeated, except that the color forming components for the cyan color forming micro capsules were changed to the following herein: Precisely, in place of the diazonium salt, herein used was an electron-donating dye precursor, 3-(o-methyl-p-diethylaminophenyl)-3-(1'-ethyl-2-methylindol-3-yl) phthalide; and in place of the base and the coupler, herein used was an electron-accepting compound, bisphenol P30. The others were all the same as in Example 10. In the full-color recording medium thus produced herein, the microcapsules had the constitution as in FIG. 7b.

The full-color recording medium was subjected to an imaging test, in which was used LED for emitting R, G and B colors for image signals. In the imaging test, the recording medium was exposed to light (0.2 mJ/mm² for each color) from LED, and then heated with a roller at 120° C. for 2 seconds to form a full-color image thereon. In this stage, the full-color image formed on the medium was sharp and vivid.

EXAMPLE 16

The full-color recording medium of Example 10 was subjected to an imaging test, in which was used LED for emitting R, G and B colors for image signals. In the imaging test, the recording medium was exposed to light (0.2 mJ/mm² for each color) from LED, and then heated with a roller at 120° C. for 2 seconds to form a full-color image thereon. Next, the thus-processed medium was exposed for 10 seconds to UV rays from an UV lamp (emission center: 365 nm, output: 40 W), whereby the image was fixed on the medium. In this stage, the full-color image formed on the medium was sharp and vivid. Even after one month, the image did not change at all and was good.

As described in detail hereinabove with reference to its preferred embodiments, the heat and light-sensitive recording material of the invention comprises a recording layer of microcapsules formed on a support, in which each microcapsule is composed of a core, a heat-responsive resin layer to cover the core, and a shell to envelop the heat-responsive resin layer. In this, the shell is made of a material sensitive to and curable with light having a predetermined wavelength, the core contains a developer (or a dye precursor), and the shell contains a dye precursor (or a developer). While being assisted by light having a predetermined wavelength and by heat, the recording material is processed to have an image formed thereon. The image can be fixed rapidly on the material.

The heat and light-sensitive recording material of the invention does not require pressure application thereto for image formation. Therefore, the size of the microcapsules to constitute the recording layer in the material can be well reduced, and high-quality images can be formed on the material.

In the heat and light-sensitive recording material of the invention, the shell of each microcapsule constituting the recording layer is covered with a resin layer having the ability to prevent the developer from flowing away. Therefore, the recording material is free from color mixing of microcapsules that form different colors.

The heat and light-sensitive recording material of the invention comprises three types of microcapsules for forming yellow (Y), magenta (M) and cyan (C) colors. Therefore, when assisted by rays of light having different wavelengths of, for example, R, G and B, and by heat, the recording material can be processed to have a full-color image formed thereon. The image can be fixed rapidly on the material.

The invention further provides a recording method with the heat and light-sensitive recording material as above. In the method, the heat and light-sensitive recording material comprising a recording layer of microcapsules formed on a support, in which each microcapsule comprising a core, a heat-responsive resin layer to cover the core, and a shell to envelop the heat-responsive resin layer, and in which the shell is made of a material sensitive to and curable with light having a predetermined wavelength, the core contains a developer (or a dye precursor), and the shell contains a dye precursor (or a developer), is processed, while being assisted by light having a predetermined wavelength and by heat, thereby having an image formed thereon. The image thus formed in the method can be fixed rapidly on the material.

In the heat and light-assisted recording method of the invention, the heat and light-sensitive recording material to be processed comprises three types of microcapsules for forming yellow (Y), magenta (M) and cyan (C) colors. Therefore, while being assisted by rays of light having different wavelengths of, for example, R, G and B, and by heat, the recording material can be processed to have a full-color image formed thereon, according to the recording method of the invention. The image thus formed in the method can be fixed rapidly on the material.

While the invention has been described in detail and with reference to specific embodiments thereof, it will be apparent to one skilled in the art that various changes and modifications can be made therein without departing from the spirit and scope thereof.

What is claimed is:

1. A heat and light-sensitive recording material including:
a support;
a dispersion of microcapsules on the support, each microcapsule containing a dye precursor and a developer capable of acting with the dye precursor to form a color, each microcapsule comprising:
a core containing one of the developer and the dye precursor,
a heat-responsive resin layer covering the core, and
a shell enveloping the heat-responsive resin layer, the shell containing the other of the dye precursor and the developer not contained in the core and being made of a material sensitive to and curable with light having a predetermined wavelength.

2. The heat and light-sensitive recording material as claimed in claim 1, in which the shell of each microcapsule is covered with a resin layer for preventing the developer from flowing away.

3. The heat and light-sensitive recording material as claimed in claim 1, in which the dye precursor is a diazonium salt.

4. The heat and light-sensitive recording material as claimed in claim 1, in which the developer is at least one of a coupler and a basic substance.

5. The heat and light-sensitive recording material as claimed in claim 1, in which the microcapsules are of at least three different types capable of forming yellow, magenta, and cyan colors.

6. The heat and light-sensitive recording material as claimed in claim 1, in which the microcapsules contain a plurality of cores in one microcapsule.

7. A heat and light-sensitive recording material including:
   a support;
   a dispersion of microcapsules on the support, each microcapsule containing a dye precursor and a developer capable of acting with the dye precursor to form a color, each microcapsule comprising:
      a core of a material sensitive to and curable with light having a predetermined wavelength and containing one of the developer and the dye precursor,
      a heat-responsive resin layer covering the core, and
      a shell enveloping the heat-responsive resin layer and containing the other of the dye precursor and the developer not contained in the core.

8. The heat and light-sensitive recording material as claimed in claim 7, in which the shell of each microcapsule is covered with a resin layer for preventing the developer from flowing away.

9. The heat and light-sensitive recording material as claimed in claim 7, in which the dye precursor is a diazonium salt.

10. The heat and light-sensitive recording material as claimed in claim 7, in which the developer is at least one of a coupler and a basic substance.

11. The heat and light-sensitive recording material as claimed in claim 7, in which the microcapsules are of at least three different types capable of forming yellow, magenta, and cyan colors.

12. The heat and light-sensitive recording material as claimed in claim 7, in which the microcapsules contain a plurality of cores in one microcapsule.

13. A heat and light-sensitive recording material having, on a support, a dispersion of microcapsules, each microcapsule containing a dye precursor and a developer capable of acting with the dye precursor to form a color, each microcapsule comprising a plurality of cores each core being covered with a heat-responsive resin layer, and a shell enveloping the heat-sensitive resin layer-covered cores at least one of the plural cores and the shell being made of a material sensitive to and curable with light having a predetermined wavelength, and the plural cores and the shell separately containing the dye precursor and the developer.

14. The heat and light-sensitive recording material as claimed in claim 13, in which the shell of each microcapsule is covered with a resin layer for preventing the developer from flowing away.

15. The heat and light-sensitive recording material as claimed in claim 13, in which the dye precursor is a diazonium salt.

16. The heat and light-sensitive recording material as claimed in claim 13, in which the developer is at least one of a coupler and a basic substance.

17. The heat and light-sensitive recording material as claimed in claim 13, in which the microcapsules are of at least three different types capable of forming yellow, magenta, and cyan colors.

18. A heat and light-sensitive recording method comprising:
   providing a heat and light-sensitive recording material having, on a support, a dispersion of microcapsules, each microcapsule containing a dye precursor and a developer capable of acting with the dye precursor to form a color, in which each microcapsule comprises a core, a heat-responsive resin layer covering the core, a shell enveloping the heat-responsive resin layer, wherein the shell is made of a material sensitive to and curable with light having a predetermined wavelength, the core contains one of the developer and the dye precursor, and the shell contains the other of the dye precursor and the developer not contained in the core; and
   exposing an area of the heat and light-sensitive recording material to light having the predetermined wavelength, to cure the shells of the microcapsules in the area, followed by heating the material so that the dye precursor and the developer in the microcapsules in a non-exposed area of the material react with each other for image formation.

19. The heat and light-sensitive recording method as claimed in claim 18, wherein the microcapsules in the recording material are of at least three different types capable of forming yellow, magenta, and cyan colors, and the shells of the microcapsules are made of different materials sensitive to and curable with light having different wavelengths, and wherein the recording material is exposed to such light having different wavelengths to form a color image.

20. The heat and light-sensitive recording method as claimed in claim 18, wherein each microcapsule includes a resin layer enveloping the microcapsule for preventing the developer from flowing away.

* * * * *